United States Patent
Paavola et al.

(10) Patent No.: US 12,262,508 B2
(45) Date of Patent: Mar. 25, 2025

(54) HEAT PIPE FOR IMPROVED THERMAL PERFORMANCE AT COLD PLATE INTERFACE

(71) Applicant: Intel Corporation, Santa Clara, CA (US)

(72) Inventors: Juha Paavola, Hillsboro, OR (US); Columbia Mishra, Mountain View, CA (US); Justin Huttula, Portland, OR (US); Mark Carbone, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 898 days.

(21) Appl. No.: 17/127,355

(22) Filed: Dec. 18, 2020

(65) Prior Publication Data

US 2021/0136956 A1 May 6, 2021

(51) Int. Cl.
*H05K 7/20* (2006.01)
*B23P 15/26* (2006.01)
*G06F 1/20* (2006.01)

(52) U.S. Cl.
CPC .......... *H05K 7/20336* (2013.01); *B23P 15/26* (2013.01); *G06F 1/206* (2013.01);
(Continued)

(58) Field of Classification Search
CPC ........... H05K 7/20336; H05K 7/20809; H05K 7/20309; H05K 7/20936; H05K 1/0203;
(Continued)

(56) References Cited

U.S. PATENT DOCUMENTS 5,769,154 A * 6/1998 Adkins ................... F28D 15/04
126/96
6,158,502 A 12/2000 Thomas
(Continued)

FOREIGN PATENT DOCUMENTS

EP 2 770 809 A1 8/2014
WO WO2018/197713 A1 11/2018

OTHER PUBLICATIONS

Y. Sungtaek Ju et al., "Planar vapor chamber with hybrid evaporator wicks for the thermal management of high-heat-flux and high-power optoelectronic devices", 2013, 7 pages, International Journal of Heat and Mass Transfer 60.
(Continued)

*Primary Examiner* — Adam B Dravininkas
(74) *Attorney, Agent, or Firm* — Banner & Witcoff Ltd.

(57) ABSTRACT

Disclosed embodiments are relate to heat transfer devices or heat exchangers for computing systems, and in particular, to heat pipes for improved thermal performance at a cold plate interface. A thermal exchange assembly includes a heat pipe (HP) directly coupled to a cold plate. The HP includes a window, which is a recessed or depressed portion of the HP. The window is attached to the cold plate at a window section of the cold plate. The cold plate is configured to be placed on a semiconductor device that generates heat during operation. The cold plate transfers the heat to the HP with less thermal resistance than existing HP solutions. Other embodiments may be described and/or claimed.

17 Claims, 16 Drawing Sheets

(52) U.S. Cl.
CPC ..... *H05K 7/20309* (2013.01); *H05K 7/20318* (2013.01); *H05K 7/20409* (2013.01); *F28F 2275/04* (2013.01); *F28F 2275/06* (2013.01)

(58) Field of Classification Search
CPC ........... H05K 7/20318; H05K 7/20409; H05K 7/20445; H05K 7/20454; H05K 7/20463; H05K 7/20472; H05K 7/20481; B23P 15/26; B23P 2700/09; G06F 1/20; G06F 2200/201; G06F 1/206; G06F 1/203; F28D 15/04; F28D 15/0275; F28D 15/046; F28F 2275/06; F28F 2255/18
See application file for complete search history.

(56) References Cited

U.S. PATENT DOCUMENTS

| | | | | |
|---|---|---|---|---|
| 6,880,626 | B2* | 4/2005 | Lindemuth | F28D 15/0233 174/15.2 |
| 6,896,039 | B2* | 5/2005 | Dussinger | F28D 15/046 165/104.21 |
| 9,551,538 | B2* | 1/2017 | Honmura | G06F 1/203 |
| 2002/0030972 | A1* | 3/2002 | Ali | F28D 15/0233 257/E23.084 |
| 2002/0056908 | A1* | 5/2002 | Brownell | H05K 1/0209 257/714 |
| 2004/0040696 | A1* | 3/2004 | Cho | F28D 15/0233 257/E23.088 |
| 2005/0082043 | A1* | 4/2005 | Sarraf | F28D 15/02 165/104.33 |
| 2005/0126757 | A1* | 6/2005 | Bennett | F28D 15/046 165/104.11 |
| 2005/0225943 | A1* | 10/2005 | Shih | H01L 23/467 165/104.33 |
| 2005/0280128 | A1* | 12/2005 | Mok | H01L 23/427 257/E23.088 |
| 2006/0237167 | A1* | 10/2006 | Lee | F28D 15/046 165/104.26 |
| 2007/0012429 | A1* | 1/2007 | Siu | F28D 15/046 165/104.33 |
| 2007/0240860 | A1* | 10/2007 | Meyer | H01L 23/427 29/890.032 |
| 2010/0263834 | A1* | 10/2010 | Hwang | F28D 15/0266 165/104.26 |
| 2017/0153066 | A1* | 6/2017 | Lin | F28D 15/046 |
| 2017/0227298 | A1* | 8/2017 | Sun | F28D 15/04 |
| 2017/0343295 | A1* | 11/2017 | Lan | F28F 9/013 |
| 2018/0128553 | A1* | 5/2018 | Lewis | F28F 3/022 |
| 2019/0343021 | A1* | 11/2019 | Zhang | H01L 21/4882 |

OTHER PUBLICATIONS

Elnaggar et al., "Heat Pipes for Computer Cooling Applications", Electronics Cooling, Ch. 4, InTechOpen, New York, USA (Jun. 15, 2016), 27 pages, available at: https://www.intechopen.com/books/electronics-cooling/heat-pipes-for-computer-cooling-applications.

Nemec, "Porous Structures in Heat Pipes", Porosity—Process, Technologies and Applications, Ch. 7, pp. 141-179 (Dec. 20, 2017).

Ladekar et al., "A Critical Review—Optimization of Heat Pipe", Int'l J. of Engineering Research & Technology, pp. 274-280 (2016).

Baraya et al., "Heat Pipe Dryout and Temperature Hysteresis in Response to Transient Heat Pulses Exceeding the Capillary Limit," Int'l J. of Heat and Mass Transfer, vol. 148, article No. 119135 (Feb. 2020).

Myriofoam White Paper, "Ultra-high capillarity metal foam wicks for passive two-phase heat transfer devices", Nov. 2, 2020, 4 pages.

Liu et al., "A lightweight and high thermal performance graphene heat pipe", Nano Select, 2020; 1-9, available at: https://doi.org/10.1002/nano.202000195 (Nov. 27, 2020).

Extended European Search Report mailed Mar. 30, 2022 for European Patent Application No. 21207406.6; 6 pages.

* cited by examiner

HEAT PIPE FOR IMPROVED THERMAL PERFORMANCE AT COLD PLATE INTERFACE

TECHNICAL FIELD

Embodiments described herein generally relate to heat transfer devices or heat exchangers for computing systems, and in particular, to heat pipes for improved thermal performance at a cold plate interface.

BACKGROUND

Heat exchangers (also referred to as "heat-transfer devices") are systems used to transfer heat between two or more fluids. A heat pipe is a heat-transfer device that combines the principles of both thermal conductivity and phase transition to effectively transfer heat between two solid interfaces. Heat pipes are the most common thermal solution in most modern computer systems and are usually used to move heat away from components such as application processor (CPUs) and graphics processors (GPUs).

Heat pipes are traditionally soldered on the top of a cold plate in most computing systems. Current heat pipe designs have limited surface area for heat transfer and also have limited thermal resistance. Usually, heat transfer capability can be increased by adding more heat pipes (typically two) and/or using multi-directional heat pipes.

BRIEF DESCRIPTION OF THE DRAWINGS

In the drawings, which are not necessarily drawn to scale, like numerals may describe similar components in different views. Like numerals having different letter suffixes may represent different instances of similar components. Some embodiments are illustrated by way of example, and not limitation, in the figures of the accompanying drawings in which.

DETAILED DESCRIPTION

Figure 1:
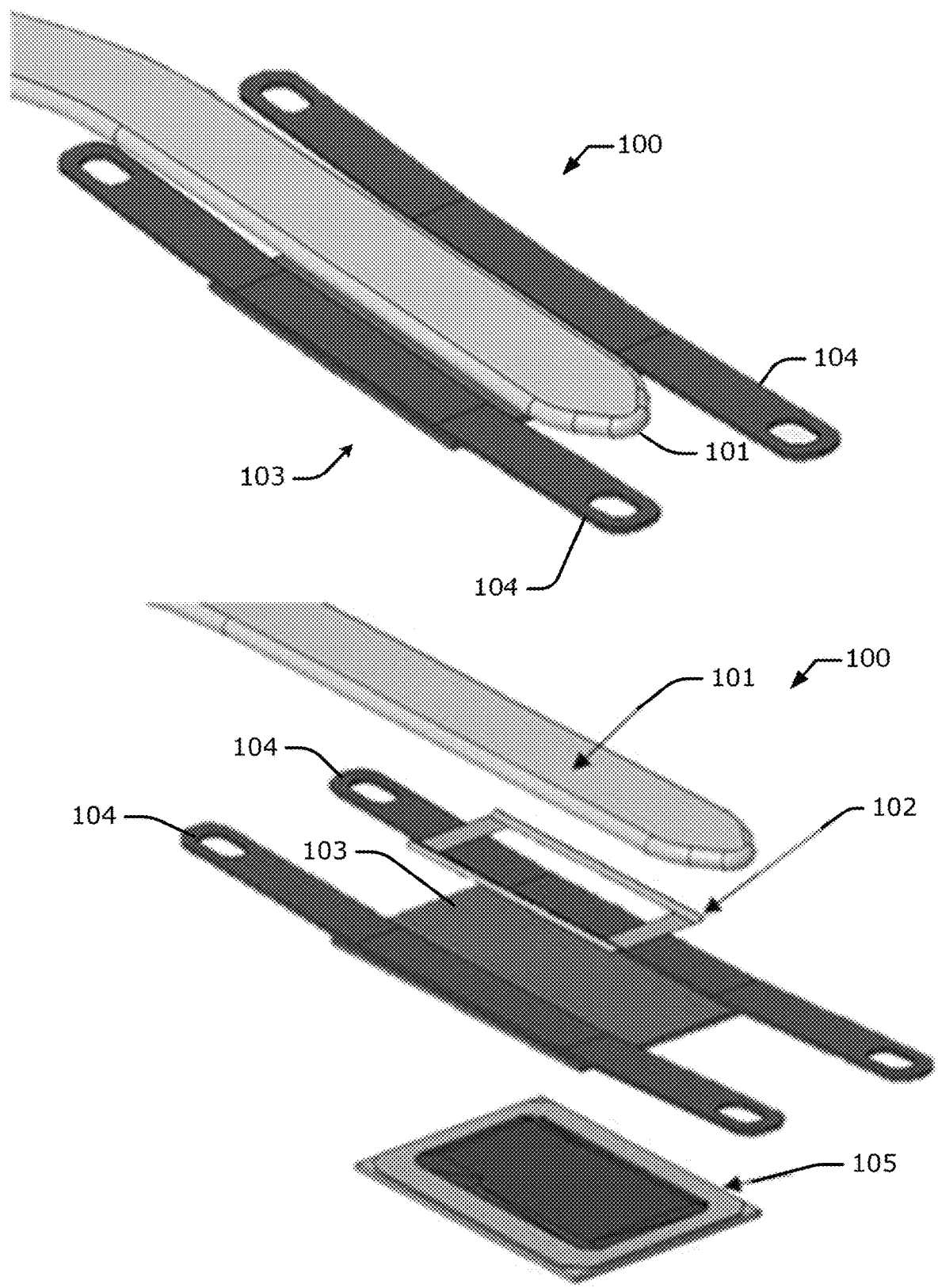
FIG. 1 shows a perspective view of a heat pipe assembly.

The following embodiments generally relate to heat transfer devices or heat exchangers for computing systems, and in particular, to heat pipes for improved thermal performance at a cold plate interface. FIG. 1 shows a perspective view of a liquid evaporation end of a (crushed or flattened) heat pipe (HP) assembly 100 and an exploded view of the thermal exchange assembly 100. The thermal exchange assembly 100 comprises an HP 101, a solder layer 102, a cold plate 103, attachment springs 104 (e.g., leaf springs), and semiconductor device 105. The solder layer 102 attaches or couples the HP 101 to the cold plate 103, and the cold plate 103 is attached to the semiconductor device 105 by way of some coupling means such as an adhesive and/or some mechanism that thermally couples the cold plate to the component. The attachment springs 104 allow the thermal exchange assembly 100 to be mounted in a computing system. The attachment springs 104 allow the thermal exchange assembly 100 to be pressed against or otherwise disposed on or next to the semiconductor device 105 to make a good thermal joint. In general, the cold plate 103 is not typically soldered or permanently attached to the semiconductor device 105, but in some instances a thermal adhesive is used to hold the thermal exchange assembly 100 on the semiconductor device 105.

The HP 101 is a hermetically sealed pipe or tube made of a material that is compatible with a working fluid sealed inside the HP 101. Typically, a vacuum pump is used to remove the air from the empty HP 101, which is then (partially) filled with the working fluid and then sealed. The working fluid mass is chosen so that the HP 101 contains both vapor and liquid over the operating temperature range. In addition, typical HP 101 construction involves the interior walls of the HP 101 being lined on the inside by a porous wick structure (not shown by FIG. 1) that becomes saturated with the working fluid during operation. The wick structure used in the HP 101 include, for example, sintered metal powders, screens, and grooved wicks, which have a series of grooves parallel to the pipe axis.

A local heat source (e.g., semiconductor device 105 when powered on) is applied to an evaporator section of the thermal exchange assembly 100, and the surface dedicated for heat rejection to the ambient is called the condenser (not shown by FIG. 1). Application of heat input causes the working fluid to evaporate at the wick and flow through the vapor core (e.g., an interior of the HP 101) to the condenser. The vapor condenses on the wick that lines the condenser surface and is passively drawn back to the evaporator via capillary forces generated in the wick. The wick structure incorporated into the HP 101 exerts a capillary action on the working fluid to return the working fluid from the condenser section to the evaporator section, even against the direction of gravity, allowing the HP 101 operate in all orientations. This cycle repeats as necessary, which is usually during operation of the semiconductor device 105. Other aspects of heat pipe theory and operation are discussed in Elnaggar et al., "Heat Pipes for Computer Cooling Applications", Electronics Cooling, Ch. 4, InTechOpen, New York, USA (15 Jun. 2016), Nemec, "Porous Structures in Heat Pipes", Porosity—Process, Technologies and Applications, Ch. 7, pp. 141-179 (20 Dec. 2017), and Baraya et al., "Heat Pipe Dryout and Temperature Hysteresis in Response to Transient Heat Pulses Exceeding the Capillary Limit," Int'l J. of Heat and Mass Transfer, vol. 148, article no. 119135 (February 2020), each of which are hereby incorporated by reference in their entireties. The operation of the HP 101 depends mainly on the parameters of the HP 101 container, working fluid, and wick structure. Selection and design of the HP 101 parts influence its operational characteristics defined by the heat transfer limitations, effective thermal conductivity, and axial temperature difference.

An increase in the heat input increases the rate of evaporation from the wick, and induces a higher fluid flow rate and pressure drop in the HP 101. The maximum heat load that the HP 101 can sustain at steady state while maintaining liquid resupply to the evaporator is governed by the capillary pressure of the wick. Any heat load inducing a fluid pressure drop higher than the capillary pressure head will result in dryout at the evaporator. This threshold heat load is commonly known as the "capillary limit." Dryout refers to a phenomenon where the working fluid is completely evaporated and the evaporator area is dry, which means that no heat can be transferred from the evaporator via the working fluid. Therefore, dryout can negatively impact the performance of the semiconductor device 105.

The capillary limit, which governs the maximum steady-state heat load on the heat assembly 100, is primarily dependent on HP 101 geometry, working fluid properties, and wick structure properties. Therefore, most conventional solutions to increasing the capillary limit focus on selecting working fluids based on thermophysical liquid properties that would yield the greatest capillary limit (including the use of fluid additives), altering the HP 101 geometry, and altering the wick structure geometry.

Furthermore, the thermal resistance of the assembly HP 100 primarily depends on the material of the HP 101 (e.g., copper, aluminum, etc.), the solder alloy of the solder layer 102, and the heat transfer area (e.g., the joint between the HP 101 and the cold plate 103). The thermal resistance is a ratio of the temperature difference between the two faces of a material to the rate of heat flow per unit area. Thermal resistance describes the heat insulation property of a material, such that as a material's thermal resistance increases that material's heat loss decreases. In conventional HP designs, it is desirable to have a large amount of working fluid at the evaporation section to handle large amounts of heat generated by powerful semiconductor devices 105. However, the thermal resistance increases as the amount of working fluid increases because there is a thicker layer of working fluid for the heat to conduct through.

The embodiments described herein increase the heat transfer area of the cold plate 103 to HP 101 vapor space without requiring relatively large amounts of working fluid and without increasing the surface area of the HP 101. According to various embodiments, a cavity or window is created on an inner surface of the HP 101 and/or on the surface of the cold plate 103. This cavity/window increases the thermal transfer area (or "thermal interface"), which increases the area for evaporation and heat transfer, and increases the area/volume for working fluid storage. In these ways, the embodiments herein increase the capillary limit and reducing the likelihood of dryout.

In various embodiments, the window or cavity in the HP 101 and/or on the surface of the cold plate 103 may include various structures of varying geometries. For example, the structures within the window/cavity may include slots or holes of various shapes and sizes. These different structures may increase the heat transfer surface that is transferring heat or evaporating the working fluid.

In some embodiments, the solder layer 102 is eliminated between the vaporizing working fluid and the heat source. In these embodiments, pure copper may be used to couple the HP 101 and the cold plate 103, which has over five times better heat conductivity than solder tin alloys. In these embodiments, any suitable brazing material may be used such as brazing materials with proven compatibility with water as a working fluid (e.g., silver, copper, phosphorous alloys) (see e.g., Sungtaek Ju et al., "Planar vapor chamber with hybrid evaporator wicks for the thermal management of high-heat-flux and high-power optoelectronic devices", Int'l J. of Heat and Mass Transfer, 60, pp. 163-169 (2013), which is hereby incorporated by reference in its entirety).

In some embodiments, the pedestal is flipped and disposed inside the tube wall, rather than being under the cold plate. In this case the solder layer 102 (e.g., about 0.10 mm) and tube wall thickness (e.g., about 0.20 mm) can be utilized for pedestal thickness, which decreases the total thickness (e.g., by about 0.30 mm).

The embodiments herein provide thermal improvement and HP 101 thickness reduction. In particular, in comparison to conventional HPs assembly designs, the embodiments herein reduce the HP 101-cold plate 103 junction thermal resistance and improve the power capabilities of various semiconductor devices. This improves the cooling effect on electronic devices, and improved electronic device cooling can lead to improved computing performance. Additionally, the embodiments herein reduce the HP dryout risks because a reservoir of liquid at the HP evaporator is created. In this way, the lifespan of the HP 101 is increased in comparison with conventional HPs.

1. Heat Pipe Assembly Embodiments

Figure 2:
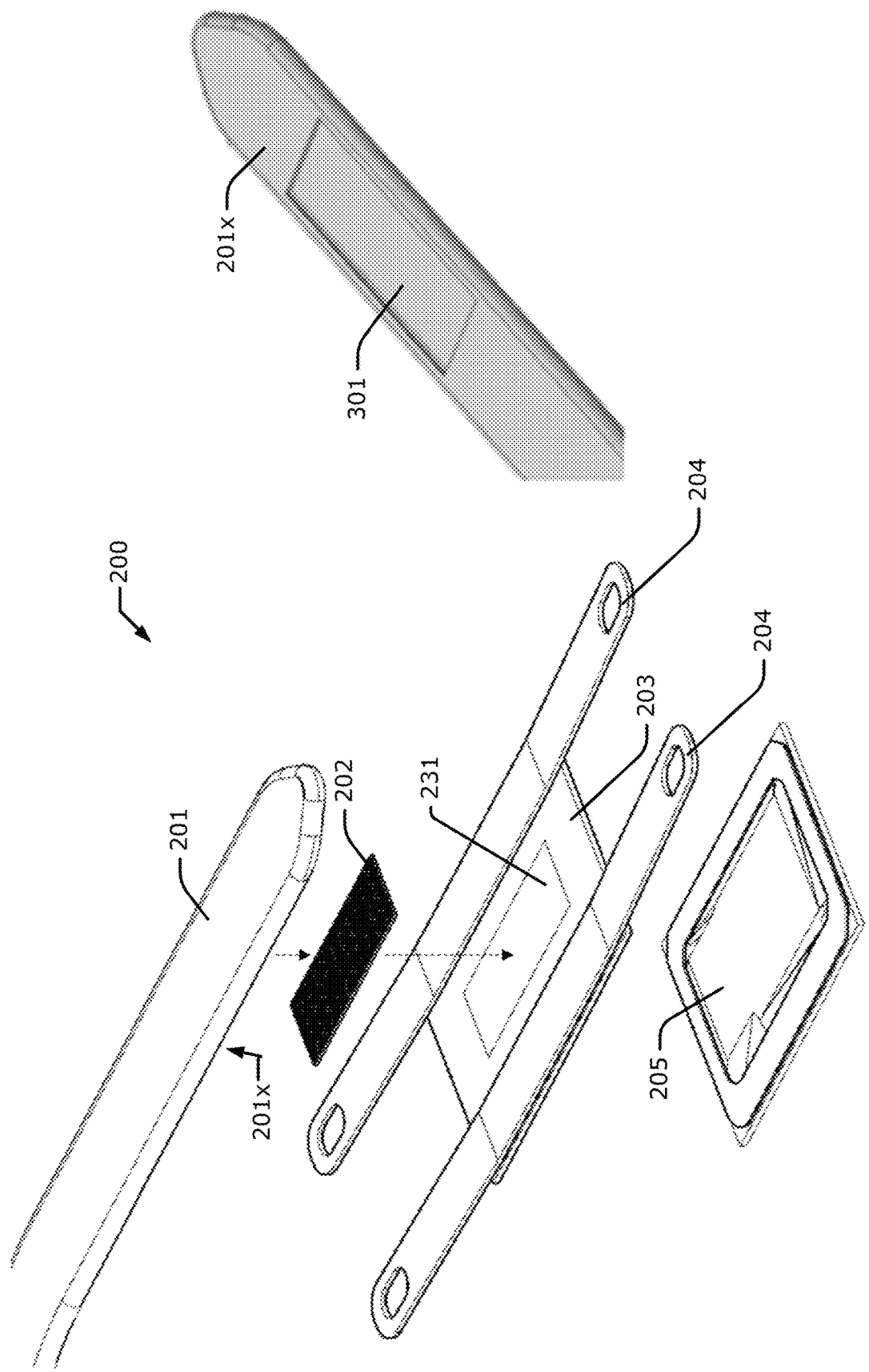
FIG. 2 shows an exploded perspective view of a heat pipe assembly according to various embodiments.
Figure 3:
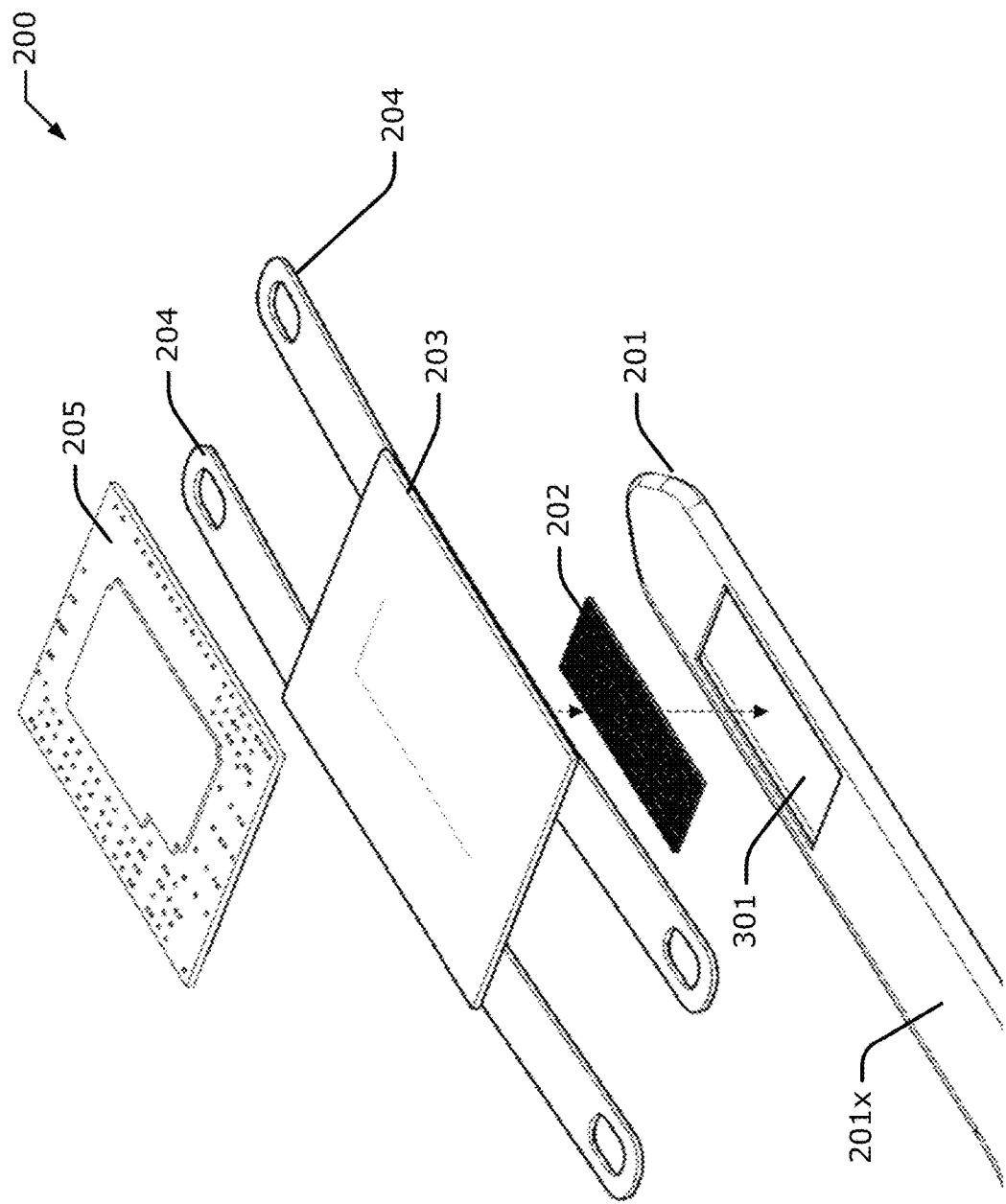
FIG. 3 shows bottom exploded perspective view of the heat pipe assembly of FIG. 2.

FIG. 2 shows an exploded perspective view of a heat pipe (HP) assembly 200 according to various embodiments. FIG. 3 shows a bottom exploded perspective view of the thermal exchange assembly 200. FIG. 3 is a flipped or upside-down view of FIG. 2. The thermal exchange assembly 200 includes an HP 201, wick structure 202, cold plate 203, attachment springs 204, and a semiconductor device 205 (e.g., a processor die, chip, package, System-on-Chip (SoC), Multi-Chip Package (MCP), etc.).

The HP 201 includes a window 301, which is shown by the bottom section 201x of the HP 201 in FIG. 2 and as shown by FIG. 3. The window 301 is an opening, cavity, ventricle, aperture, pocket, gap, lacuna, hole, recess, socket, receptacle, depression, crater, concavity, or any other type of space, area, or region in the HP 201 that improves the heat transfer properties of the HP 201 (in comparison to conventional HP designs) as discussed herein. In some implementations, the length of the window 301 frame is about two to four millimeters (mm) long, and the width of the window 301 frame is about two to four mm wide. In other implementations, the window size is based on the size of the other parts of the thermal exchange assembly 200. In these implementations, the length and width of the window 301 is based on the length and width of the cold plate 203 so that a suitable amount of surface area around the window 301 can be used to provide a seal to the cold plate 203. In one example, the width of the window 301 is about 90% of the width of the HP 201 and/or the cold plate 203, and the length of the window 301 is about 90% of the length of the cold plate 203. Other dimension ratios between window 301 size and cold plate 203 size may be used in other embodiments. The cold plate 203 includes a window section 231 (see e.g., FIG. 2), which is a region of the cold plate 203 on which the HP 201 is disposed, and/or a region of the cold plate 203 that is sealed to the HP 201.

In some embodiments, such as the embodiments of FIGS. 2 and 3, the window section 231 is a substantially flat portion of the cold plate 203. In these embodiments, the window section 231 may have similar geometry/dimensions (e.g., shape, length, and width) as the geometry/dimensions (e.g., shape, length, and width) of the window 301. In other embodiments, such as the embodiments of FIGS. 4 and 5 discussed infra, the window section 231 may comprise an opening, cavity, ventricle, aperture, pocket, gap, lacuna, hole, recess, socket, receptacle, depression, crater, concavity, or any other type of space, area, or region in the cold plate 203. In these embodiments, the opening of the window section 231 may have a same or similar geometry/dimensions (e.g., shape, length, width, height/depth) as the geometry/dimensions (e.g., shape, length, width, height/depth) as the window 301. In other embodiments, the opening of the window section 231 may have a different geometry (e.g., shape, length, width, height/depth) than the geometry (e.g., shape, length, width, height/depth) of the window 301.

In various embodiments, the HP 201 and/or the cold plate 203 may be formed of any suitable material or combination of materials, such as one or more materials with high thermal conductivity and good mechanical strength. As examples, the HP 201 and/or the cold plate 203 may be formed of copper, a copper alloy, aluminum, or an aluminum alloy. The material(s) used for the HP 201 and/or the cold plate 203 may be based on specific use case, system implementation, and/or any other criteria or parameters. For example, the HP 201 may be formed of copper or a copper alloy when the working fluid is water, the HP 201 may be formed of aluminum when the working fluid is ammonia-based. Other metals and/or other materials such as epoxy or polymer matrix can be used in other implementations. In one example, the HP 201 may be formed from epoxy-impregnated carbon fiber with thin aluminum shells or metal/matrix composites. In another example, the HP 201 may be a graphene heat pipe (GHP) such as those discussed in Liu et al., "A lightweight and high thermal performance graphene heat pipe", Nano Select, 2020; 1-9, available at: https://doi.org/10.1002/nano.202000195 (27 Nov. 2020), which is hereby incorporated by reference in its entirety. In some embodiments, the HP 201 and the cold plate 203 may be formed from the same or similar materials, while in other embodiments, the HP 201 and the cold plate 203 may be formed of different materials.

In the embodiment of FIGS. 2 and 3, a wick structure 202 may be added to the thermal exchange assembly 200 in addition to an existing wick structure inside the HP 201. The wick structure 202 is added into the window 301 when the HP 201 is coupled to the cold plate 203 during assembly/manufacture. The wick structure 202 may be placed on or attached to the wick section 231 of the cold plate 203 by any suitable coupling means such as, for example, soldering, tack welding, brazing, weaving, and/or the like. In some embodiments, the wick structure 202 is simply held by pressure during final assembly of the thermal exchange assembly 200. This may provide some cost reductions because the cold plate 203 does not need a secondary manufacturing operation to create the positive or negative features in or on the cold plate 203 and/or window/cavity 301.

Figure 4:
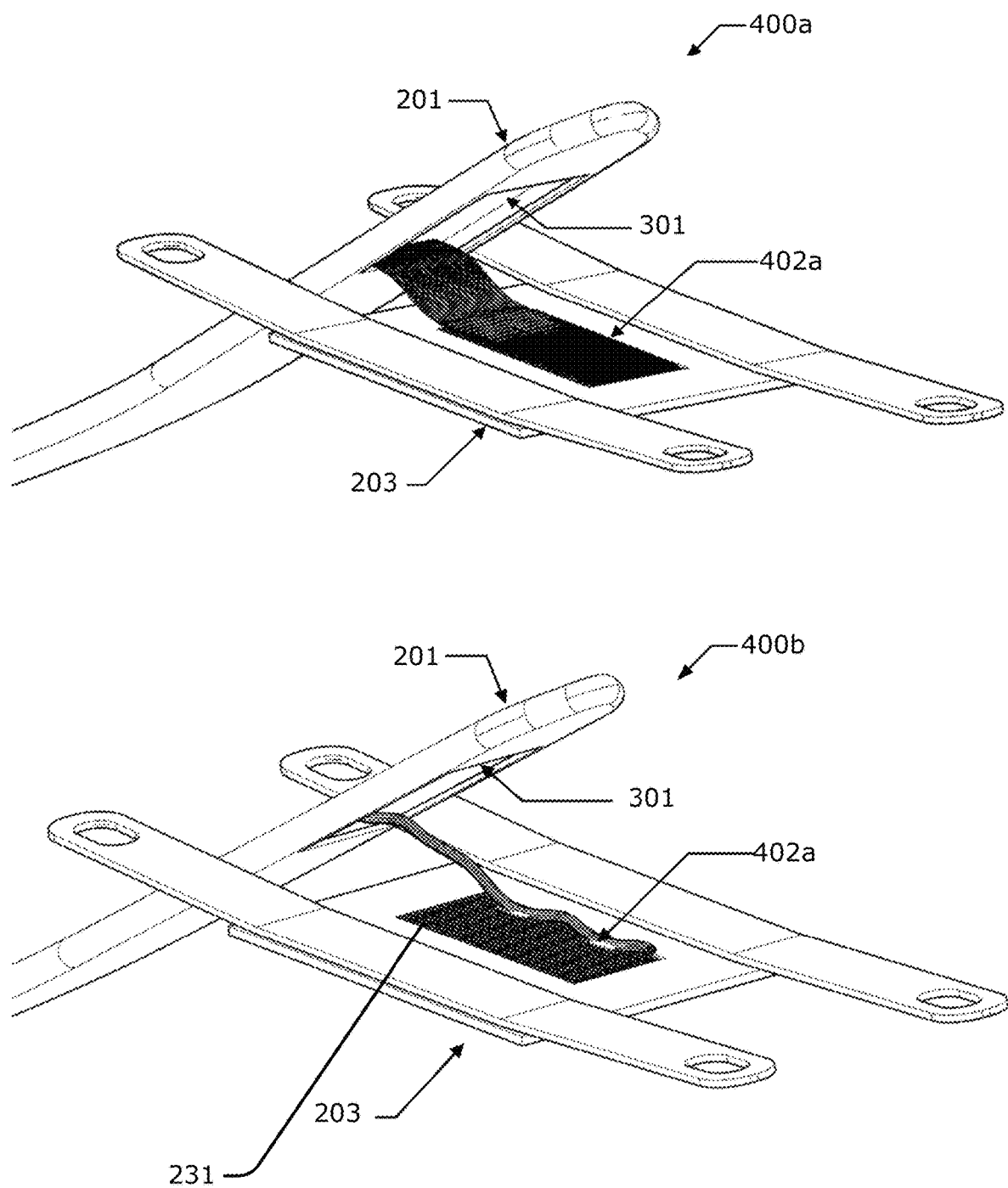
FIGS. 4 and 5 show perspective views of heat pipe assemblies during construction according to various embodiments.

FIG. 4 shows example thermal exchange assembly 400*a* and thermal exchange assembly 400*b* according to various embodiments. In addition to the elements discussed previously, the thermal exchange assembly 400*a* includes a flattened annular wick 402*a* and the thermal exchange assembly 400*b* includes a fiber type wick 402*b*. In these embodiments, the wick 402*a-b* from inside the HP 201 is attached to the cold plate 203 instead of adding an additional wick structure 202 as is the case in the embodiment of FIGS. 2-3. The native wick 402 of the HP 201 removed from the HP 201 and/or is fed/passed out the window 301 and coupled/attached to the cold plate 203 using a suitable coupling means before the HP 201 is coupled/attached to the cold plate 203. These embodiments improve fluid transport directly to the cold plate 203 surface in the window section 231. The native wick 402 (or inverted wick 402) may be any type of wick structure that exists within or lines the inside of the HP 201. In other implementations, the wick 402 is not attached or does not line the side wall of the HP 201, and can be loose within the HP 201.

Figure 5:
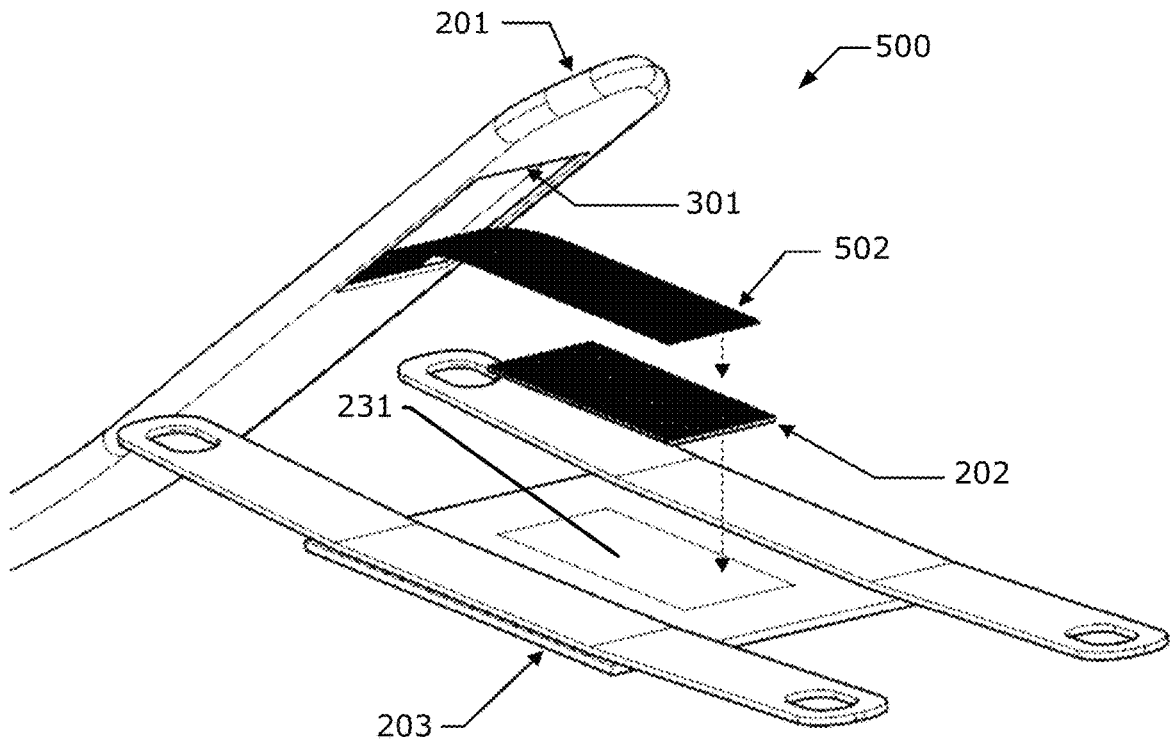

FIG. 5 shows an example thermal exchange assembly 500 according to various embodiments. In this embodiment, the native wick 502 of the HP 201 is passed out of the window 301 and coupled to an additional wick 202, and the additional wick 202 is coupled to the cold plate 203 before the HP 201 is attached to the cold plate 203. The native wick 502 may be the same or similar to the wicks 402*a*, 402*b*, and/or any other wick structure discussed herein. The native wick 502 may be coupled or attached to the additional wick 202 using any suitable coupling means such as, for example, soldering, tack welding, brazing, weaving, and/or using any other like coupling means, such as those discussed herein. Additionally, the additional wick 202 may be coupled or attached to the window section 231 of the cold plate 203 using any suitable coupling such as, for example, soldering, tack welding, brazing, weaving, and/or using any other like coupling means, such as those discussed herein. Similar to the embodiments of FIG. 4, the embodiment of FIG. 5 improves fluid transport to window region of the heat pipe.

The embodiments shown by FIGS. 2-5 improves the interface between the cold plate 203 and the HP 201. During operation, the semiconductor device 205 under the cold plate 203 generates heat, and the cold plate 203 spreads and conducts the heat to the HP 201. The window 301 in the HP 201 creates a reservoir that stores more working fluid than conventional HPs so that there is more working fluid to evaporate when needed to cool the semiconductor device 205. This creates more surface to transfer the heat from the cold plate 203 to the working fluid, which improves heat transfer capabilities of the HP 201.

In various embodiments, the wick structures 202, 402*a*, 402*b*, 502 may be any suitable type of wick structure such as, for example, grooved wicks (e.g., axial groove wicks), sintered wicks, screen wicks (e.g. wrapped screen wicks), mesh wicks, fiber wicks, braid wicks, cable-bundle wicks, and/or the like. In some embodiments, the wick structures 202, 402*a*, 402*b*, 502 may be homogeneous wicks, which are wicks including a single material and configuration. In other embodiments, the wick structures 202, 402*a*, 402*b*, 502 may be composite wicks, which are wicks including two or more materials and/or configurations. Additionally, any suitable working fluid may be used inside the HP 201 such as, for example, helium, nitrogen, ammonia, acetone, methanol, ethanol, water, mercury, caesium, potassium, sodium, lithium, silver, and/or any other working fluid. Furthermore, the shape and dimensions of the HP 201 may be different than shown by FIGS. 2-5. For example, the HP 201 shown by FIGS. 2-5 is a planar HP (or vapor chamber), while in other embodiments, the HP 201 may be a variable conductance HP (VCHP), a pressure controlled HP (PCHP), a diode HP, a thermosyphon (or thermosiphon), a rotating HP, a loop HP, and/or any other type of HP.

Figure 6:
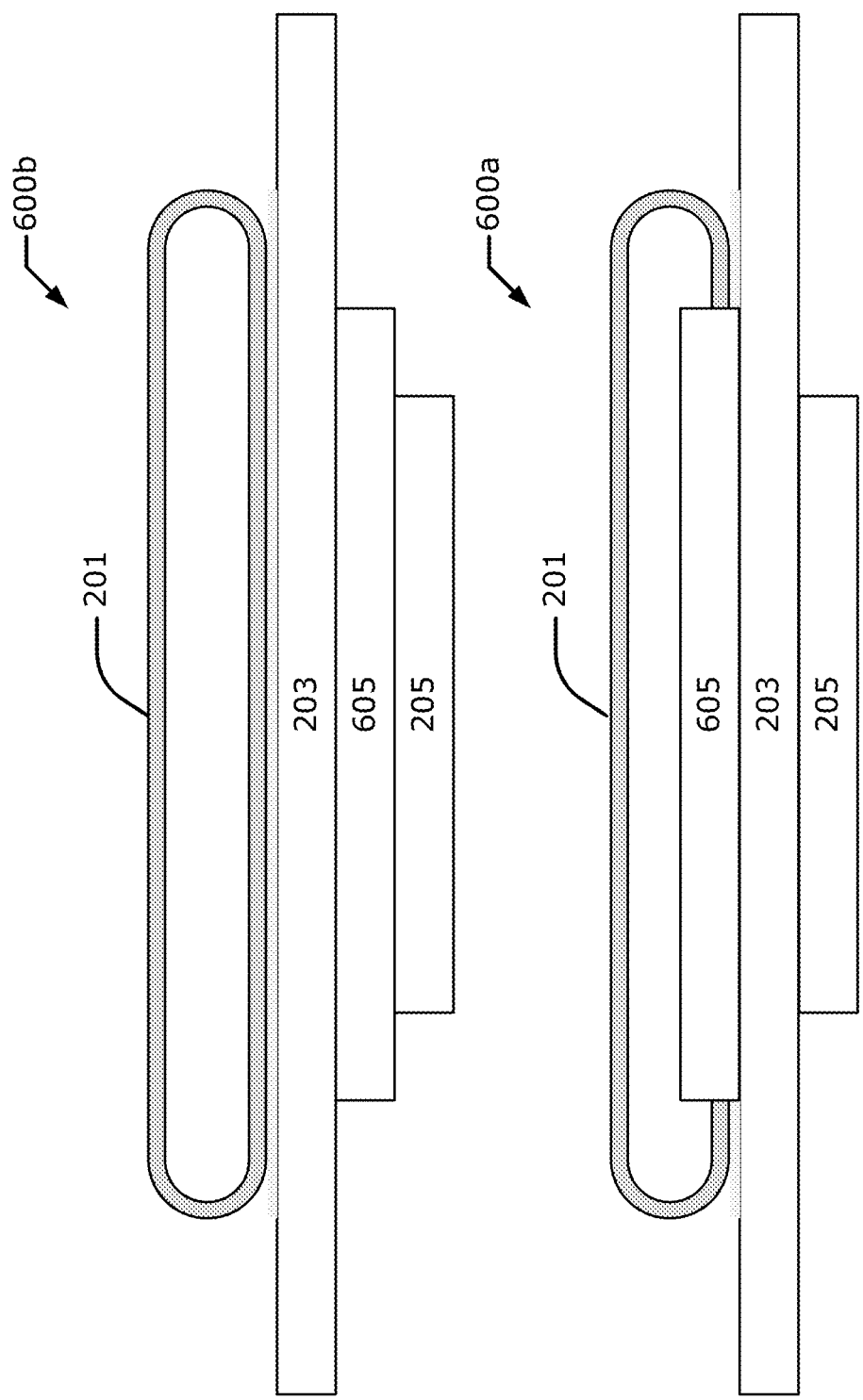
FIG. 6 shows an example flipped pedestal arrangement according to various embodiments.

FIG. 6 shows a flipped pedestal arrangement 600*a* in comparison with a traditional pedestal arrangement 600*b*, according to various embodiments. The traditional pedestal arrangement 600*b* provides a pedestal 605 disposed between the semiconductor device 205 and the cold plate 203 to improve the stiffness of the cold plate 203 and allows thin bondline. Usually, the solder layer 102 between the pedestal 605 and the cold plate 203 to couple the pedestal 605 to the cold plate 203. In various implementations, the cold plate 203 and the pedestal 605 are formed of the same material (e.g., copper). However, there is some increased thermal resistance due to the solder layer 102. In the flipped pedestal arrangement 600a, the pedestal 605 is disposed inside the HP 20, and in particular, on an inner wall of the HP 201 and/or inside the window 301. This allows the solder layer 102 to be removed from the thermal exchange assembly 200.

The flipped pedestal arrangement 600a provides both structural and thermal enhancements to the thermal exchange assembly 201. The thermal enhancements are realized by the removal of the HP 201 wall and the solder layer 102 from the thermal conduction path (or heat transfer path). The elimination of the solder layer 102 removes the thermal resistance caused by the solder material. The removal of the HP 201 wall allows for the increase in mass of the cold plate 203 material (e.g., copper) directly on the top of the semiconductor device 205. The structural improvements are realized by replacing the relatively soft HP 201 wall material with cold plate 203 material, which is usually formed of a harder or stiffer material than the HP 201. Additionally, the cold plate 203 material does not have to be crushed or flattened (as is the case with the HP 201), which allows a high stiffness and high strength alloy to be used (e.g., a copper alloy). The structural improvements are also realized by reducing the overall height of thermal exchange assembly 200 by the wall thickness of the HP 201, which can save space inside the computing system chassis.

In addition to the thermal and structural improvements, characteristics of the pedestal 605 can be adjusted depending on a particular use case or system implementation. For example, the pedestal 605 may be fabricated to be as thick as possible, fabricated to be as thin as possible, and/or fabricated using any suitable fabrication means to have a specific pattern formed on or etched in the pedestal 605 such as the patterns discussed infra.

2. Heat Pipe Window and Cold Plate Configurations and Arrangements

As shown by FIGS. 2 and 3, one embodiment of the window 301 is a rectangular shaped opening, cavity, etc., which can be filled with a suitable wick material/structure (e.g., wicks 202, 402a-b, 502, and/or the like). In other embodiments, the window 301 may have different dimensions and/or a different shape than that shown by FIGS. 2 and 3. In one example, the window may have a length or width that is substantially the same as the HP 201 (where the HP 201 comprises a relatively thin boundary around the window 301). The dimensions and/or shape of the window 301 may be selected based on the specific use case or computing system implementation, and/or based on any other parameters or criteria.

Figure 7A:
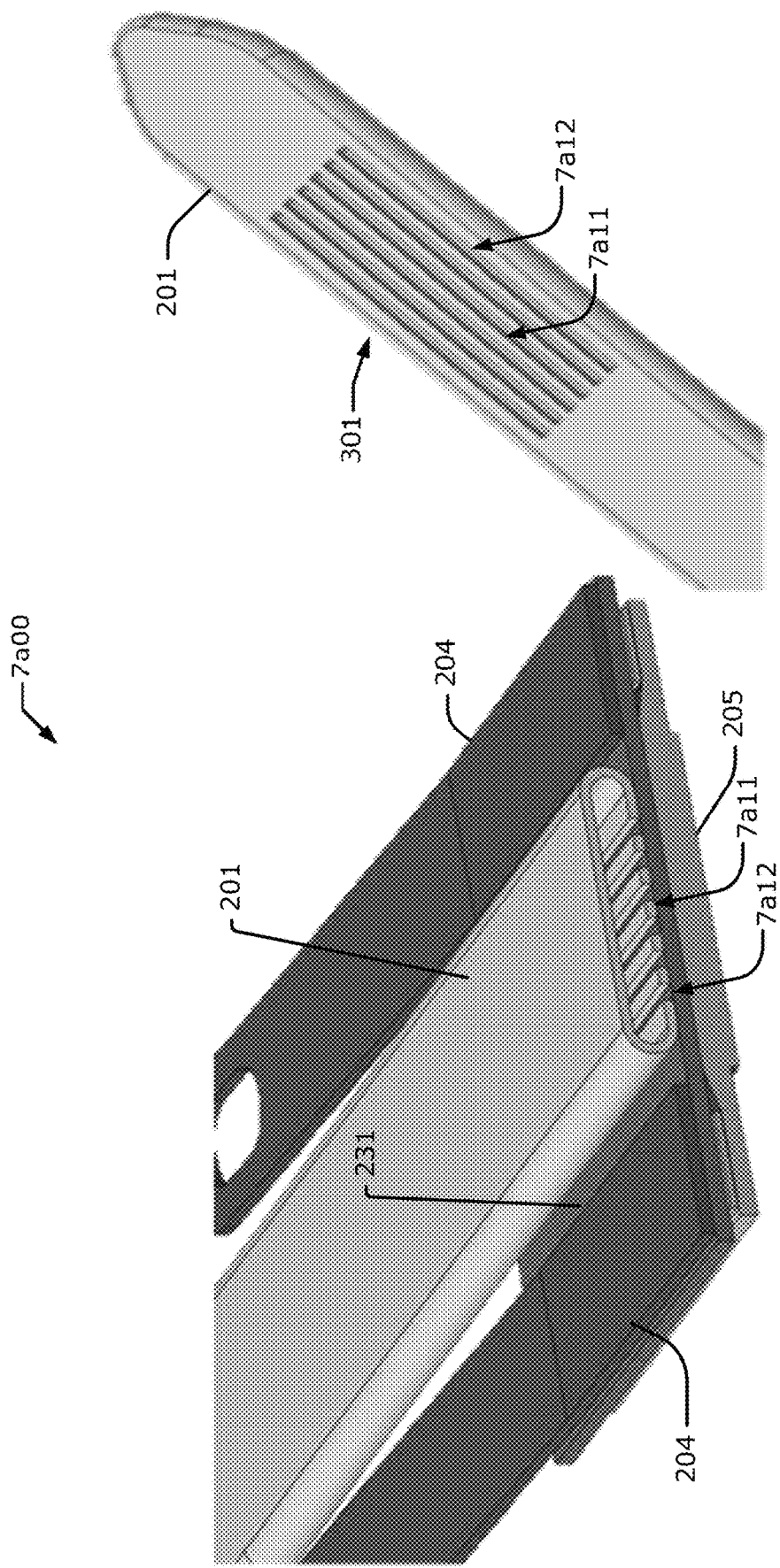
FIGS. 7a, 7b, and 7c show perspective cross-section views of a heat pipe assembly with various window arrangements, according to various embodiments.
Figure 7B:
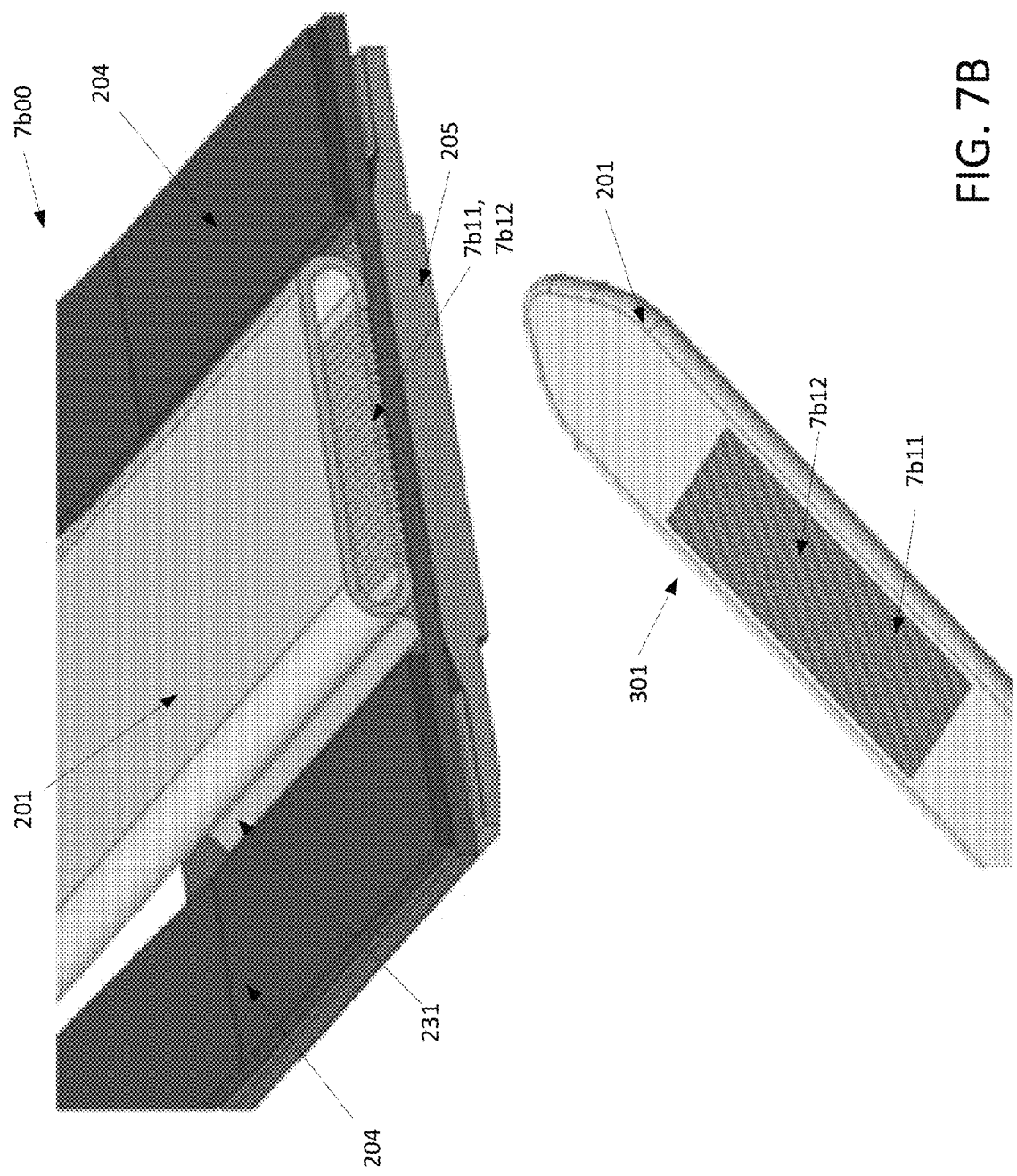
Figure 7C:
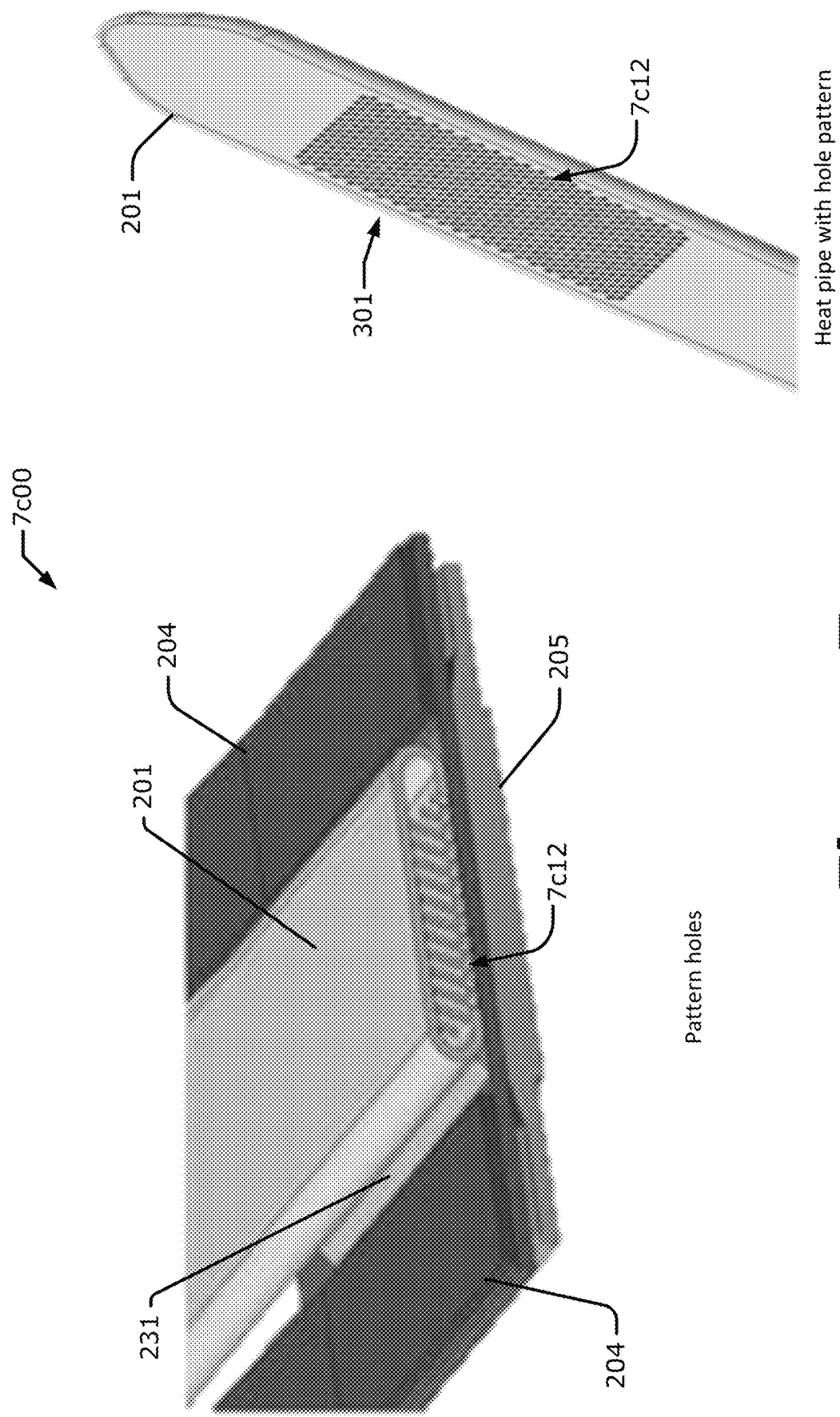

In other embodiments, the window 301 may be formed/fabricated to include one or more geometries, some of which are shown by FIGS. 7a, 7b, and 7c.

FIGS. 7a, 7b, and 7c show perspective cross-section views of the thermal exchange assembly 200 with various window/cavity arrangements/configurations, according to various embodiments. FIG. 7a shows a window embodiment 7a00 where the window 301 includes a plurality of fins 7a11 extending vertically (or in a z-axis direction) from the bottom of the window 301 towards an outer surface of the HP 201. The fins 7a11 also form individual slots 7a12 (also referred to as "channels" or "grooves") between the fins 7a11. In these embodiments, the slots 7a12, 7b12 may be considered to be individual windows/cavities similar to the window 301 discussed previously. The fins 7a11 are oriented in a longitudinal (or "length-wise") direction with respect to the HP 201. In some embodiments, the fins 7a11 may be oriented in a diagonal direction and/or lateral (or "width-wise") direction with respect to the HP 201. Individual fins 7a11 and/or slots 7a12 may be arranged in any suitable orientation or pattern, which may be based on the geometry of the window 301 and/or the HP 201, selected for a specific use case and/or implementation, and/or based on any other criteria or parameters.

FIG. 7b shows another window embodiment 7b00 where the window 301 includes a plurality of fins 7b11 that are narrower than the fins 7a11. The fins 7b11 also form individual slots 7b12 (also referred to as "channels" or "grooves") between the fins 7b11. In these embodiments, the slots 7b12 may be considered to be individual windows/cavities similar to the window 301 discussed previously. The fins 7b11 are oriented in a diagonal direction with respect to the HP 201. In some embodiments, the fins 7b11 may be oriented in a longitudinal direction or a lateral direction with respect to the HP 201. Individual fins 7b11 and/or slots 7b12 may be arranged in any suitable orientation or pattern, which may be based on the geometry of the window 301 and/or the HP 201, selected for a specific use case and/or implementation, and/or based on any other criteria or parameters.

The geometries/dimensions (e.g., length, width, height, etc.) of each fin 7a11, 7b11 can be uniform or the same as each other fin 7a11, 7b11, or the geometries/dimensions of one or more fins 7a11 can be different than one or more other fins 7a11, 7b11. In one example, the height of one or more fins 7a11, 7b11 can be the absolute value of the window 301 or slot 7a12, 7b12 depth (e.g., where the window 301 is X millimeters (mm) deep, the one or more fins 7a11, 7b11 can be X mm, where X is a number). In another example, the height of one or more fins 7a11, 7b11 can be smaller than the absolute value of the window 301 or slot 7a12, 7b12 depth (e.g., where the window 301 is X mm deep, the one or more fins 7a11, 7b11 can be X-Y mm, where X and Y are numbers). In another example, the height of one or more fins 7a11, 7b11 can be larger than the absolute value of the window 301 or slot 7a12, 7b12 depth (e.g., where the window 301 is X mm deep, the one or more fins 7a11, 7b11 can be X+Y mm, where X and Y are numbers). Furthermore, one or more fins 7a11, 7b11 can have different lengths and/or widths than one or more other fins 7a11, 7b11.

Additionally or alternatively, the geometries/dimensions (e.g., length, width, height/depth, etc.) of each slot 7a12, 7b12 can be uniform or the same as each other slot 7a12, 7b12, or the geometries/dimensions of one or more slots 7a12, 7b12 can be different than one or more other slot 7a12, 7b12. For example, the depth of each slot 7a12, 7b12 can be the same depth as every other slot 7a12, 7b12; can be deeper than the depth of one or more other slots 7a12, 7b12; or can be less deeper (shallower) than the depth of one or more other slots 7a12, 7b12. In some embodiments, the slots 7a12, 7b12 can be filled with a suitable wick material/structure such as those discussed herein. The wick material/structure in each of the slots 7a12, 7b12 can be the same as wick material/structure in each other slot 7a12, 7b12, or one or more slots 7a12, 7b12 can have different wick material/structures than one or more other slots 7a12, 7b12.

FIG. 7c shows another window embodiment 7c00 where the window 301 includes a plurality of cylindrical holes 7c12 with circular or elliptical shaped openings. The holes 7c12 may be arranged in any suitable pattern, which may be based on the geometry of the window 301 and/or the HP 201, selected for a specific use case and/or implementation, and/or based on any other criteria or parameters. Additionally or alternatively, the geometries/dimensions (e.g., radius, diameter, circumference, depth, etc.) of each hole 7c12 can be uniform or the same as each other hole 7c12, or the geometries/dimensions of one or more holes 7c12 can be different than one or more other holes 7c12. For example, the depth of each hole 7c12 can be the same depth as every other hole 7c12; can be deeper than the depth of one or more other holes 7c12; or can be less deeper (shallower) than the depth of one or more other holes 7c12. In some embodiments, the holes 7c12 can be filled with a suitable wick material/structure such as those discussed herein. The wick material/structure in each of the holes 7c12 can be the same as wick material/structure in each other hole 7c12, or one or more holes 7c12 can have different wick material/structures than one or more other holes 7c12.

Figure 7D:
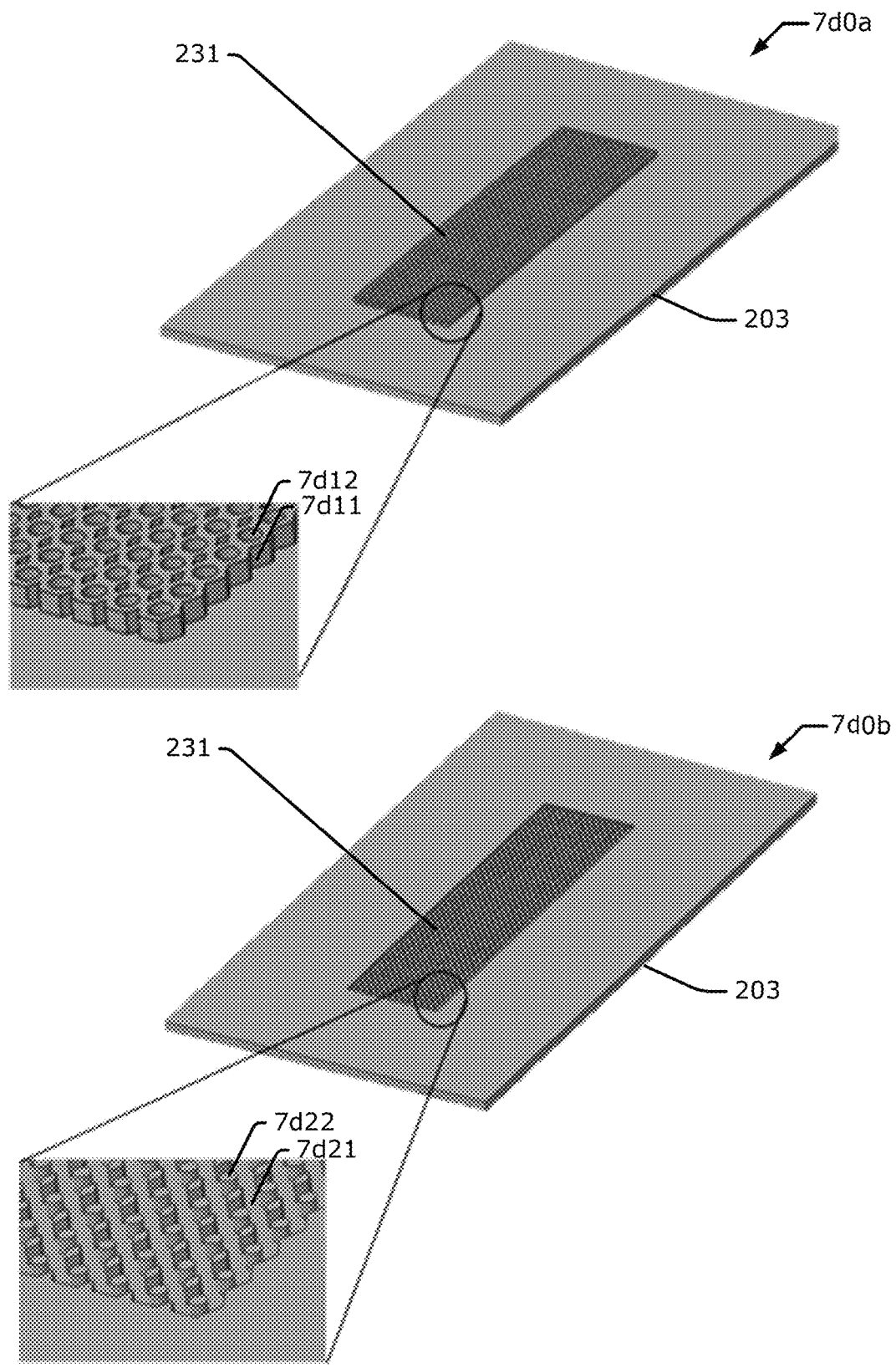
FIG. 7d shows perspective views of a cold plate with different window section arrangements according to various embodiments.

Additionally or alternatively to the embodiments of FIGS. 7a, 7b, and 7c, in some embodiments, the cold plate 203 may be formed/fabricated to include one or more capillary or wicking elements, some of which are shown by FIG. 7d.

FIG. 7d shows two examples of the cold plate 203 with different window section 231 arrangements/configurations, according to various embodiments. In particular, arrangement 7d0a shows a positive textured window section 231 having a plurality of pins 7d11 protruding or otherwise extending from a surface of the cold plate 203 with holes/slots 7d12 through a center portion of each pin 7d11. Arrangement 7d0b shows a negative textured window section 231 having a plurality of holes/slots 7d22 extending into the surface of the cold plate 203 thereby creating pins/fins 7d21 in and around the slots 7d22.

In arrangement 7d0a, the pins 7d11 have a hexagonal cylinder shape and holes 7d12 have a circular shape. In arrangement 7d0b, the slots 7d22 are holes with a cylindrical or diamond shaped and pins/fins 7d21 have an elongated shape. These shapes are meant to be exemplary, and in various other embodiments, the geometries/dimensions of the pins 7d11, 7d21 and slots/holes 7d12, 7d22 may be different than those shown. Furthermore, the geometries/dimensions of the pins 7d11, 7d21 and slots/holes 7d12, 7d22 may be the same as one another, or may be different than one another. The specific arrangement or pattern of pins the pins 7d11, 7d21 and slots/holes 7d12, 7d22 may be selected based on parameters of the cold plate 203 and/or HP 201, selected for a specific use case, and/or based on any other criteria or parameters.

The various approaches discussed herein may be combined in multiple ways to create multiple opportunities for performance improvements. For example, the negative textured design in arrangement 7d0b holds working fluid at the evaporator of the HP 201 to delay dryout. If a traditional HP were to simply include extra working fluid at the evaporator end, thermal resistance would be increased by the need to conduct heat through the working fluid layer. Importantly, the pins 7d22 of the negative textured cold plate 203 in arrangement 7d0b retain low evaporative resistance because they do not allow a continuous puddle of working fluid in the evaporator area. In these embodiments, the HP 201 may include a fiber wick 402, 502.

In traditional HPs, a piece of screen is placed at the evaporator end to spread the liquid for maximum evaporative area. In contrast, one version of the negative textured cold plate 203 arrangement 7d0b uses pins/fins 7d21 or similar structures with sufficient capillary action to spread the working fluid without the need for a screen, further reducing thermal resistance from the bottom of the cold plate 203 into the HP 201 vapor space.

3. Heat Pipe Assembly Construction Embodiments

Conventionally, HPs are manufactured by forming a cylinder pipe, adding some type of working fluid inside the pipe, sealing the pipe, and then flattening the pipe. The HP is then mounted in a computing system via the attachment springs 104/204 (see e.g., computing platform 1200 of FIG. 12).

Figure 8:
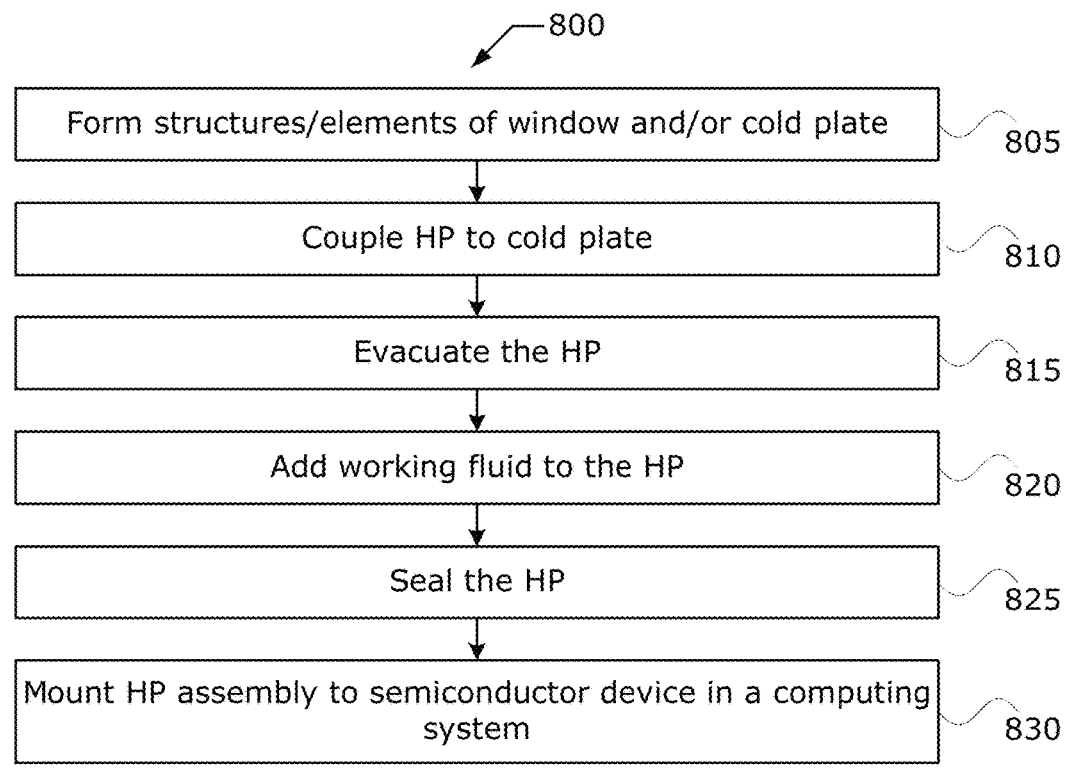
FIG. 8 depicts example processes for constructing a heat pipe assembly according to various embodiments.

FIG. 8 shows an example manufacturing or construction process 800 for constructing the thermal exchange assembly 200, according to various embodiments. Process 800 starts at operation 805 where the structures/elements are formed on/in the window 301 and/or the cold plate 203. Next at operation 810, the HP 201 is coupled to the cold plate 203. Additionally, prior to, or during the HP 201-cold plate 203 coupling process (810), any additional wicks (e.g., wick 202 of FIGS. 2 and 3), and/or any native wicks (e.g., wicks 402a-b and/or 502 of FIGS. 4 and 5) may be coupled to the wick section 231 of the cold plate 203.

Then, the HP 201 is evacuated using, for example, vacuum pressure at operation 815, working fluid is added to the HP 201 at operation 820, and the HP 201 is hermetically sealed at operation 825. In various embodiments, the HP 201 is coupled to the cold plate 203 (815) before the HP 201 is evacuated (820), charged with working fluid (820), and sealed (825). When the thermal exchange assembly 200 at operation 825, thermal exchange assembly 200 may then be placed on a semiconductor device 205 and/or otherwise mounted in the chassis of a computing system at operation 830, such as the computing platform 1200 of FIG. 12.

According to various embodiments, the window 301 and/or the cold plate 203 (or elements thereof) is/are formed in a separate process prior to constructing the thermal exchange assembly 200 (805). It may be possible to realize the thermal improvements of the embodiments herein by creating or otherwise forming a narrow, long, vapor chamber (e.g., an HP) with the described features added to the evaporator section. Such a vapor chamber may be more costly than existing HPs because it cannot realize the economies of being fabricated from tube stock. The common tube stock used in the manufacture of HPs is one of the key reasons HPs are so inexpensive. Forming a window 301 (with or without the additional elements discussed in FIGS. 7a, 7b, and 7c) into a flattened tube is a straightforward manufacturing procedure. If the window 301 with or without the additional features were applied to an existing vapor chamber of an already constructed thermal exchange assembly, it would be necessary to make all of the required parts individually, then form and assemble them before reflow. Such a vapor chamber is more costly than the HP 201 assembly described herein due at least to the complexity of such a process.

The various window 301 and cold plate 203 configurations/arrangements as shown by FIGS. 2, 3, 7a, 7b, 7c, and 7d may be formed or fabricated using any suitable fabrication means, such as being forged, machined, etched, additive manufacturing, and/or any fabrication means such as those discussed herein. In one example, a ganged slitting saw or laser etching tool may be used to create slots/holes 7a12, 7b12, 7c12, 7d12, 7d22. Ganged slitting saws are available in pure carbide, so they can be re-sharpened to reduce manufacturing costs. Where additive manufacturing is used, different materials may be used for the configurations/arrangements of FIGS. 2, 3, 7a, 7b, 7c, and 7d than those used for the HP 201 and/or cold plate 203.

In one example where a textured cold plate 203 is used (see e.g., FIG. 7d), textures/elements of the cold plate 203 can be manufactured by etching or forging. An etch process can be run long enough to decrease the thickness of the cold plate 203 (e.g., copper) layer in the etched area, while the peripheral area of the cold plate 203 remains at full thickness and retains mechanical strength. The etched area need only be thick enough to provide mechanical strength for a required pressure, such as Second Level Thermal Interface Material (TIM2) pressure. The thinned area of cold plate 203 (e.g., copper) in the negative textured cold plate 203 may be etched until it is thinned, reducing the thickness of the conduction path and further increasing performance. Such a long etch process could create undercutting, but the exact forms of the pins 7d11, 7d21 are not important, so there is little concern with undercutting issues.

In some embodiments, the HP 201 is soldered to the cold plate 203 as in traditional construction (810), while in other embodiments, the HP 201 is welded to the cold plate 203. In these embodiments the HP 201 is directly soldered to the cold plate 203. In other embodiments, a brazing technique, such as torch brazing, furnace brazing, vacuum brazing, etc., can be used to couple the HP 201 to the cold plate 203. In some embodiments, an adhesive (e.g., epoxy) or other chemical agent be used to couple the HP 201 to the cold plate 203.

In one example, for the slotted window 301 embodiments (see e.g., FIGS. 7a and 7b), the solder joint between the cold plate 203 and the HP 201 is made by first tinning one of the articles with the suitable solder and then passing the parts through a reflow oven. This creates an air-tight seal between the HP 201 and the cold plate 203, and joins the HP 201 bars/fins 7a11, 7b11 in the window 301 directly to the cold plate 203 but keeps the slots 7a12, 7b12 free from solder to maximize the surface area. Additionally or alternatively, for the slotted window 301 embodiments, a formed screen is placed at the evaporator end, where the screen is formed to protrude into the slots 7a12, 7b12. Additionally or alternatively, for the slotted window 301 embodiments, a texture is applied to the inner slot 7a12, 7b12 area to give capillary action so no screen would be necessary. In some embodiments, a solder seal is made in a frame around the window 301 opening (similar to the solder layer 102 in FIG. 1). Additionally, no solder should enter the cavity area of the window 301. This may be accomplished by reflowing either after tinning one side first or using a suitable solder paste screened in the appropriate pattern. When using solder to couple the HP 201 to the cold plate 203, the solder alloy should be compatible with the working fluid so as to avoid corrosion of the HP 201 and working fluid contamination. For example, when the working fluid is water, the solder alloy may comprise silver, copper, and/or phosphorous.

For embodiments where a native wick is coupled to the wick section 231 of the cold plate 203 (see e.g., wicks 402a-b and/or 502 of FIGS. 4 and 5) the flattened wick (e.g., mesh or fiber wick) may be pulled out of the HP 201 and attached to the wick section 231 using any suitable coupling means. In some embodiments, an additional piece of porous material may be coupled to the end of the native wick to further enhance the fluid transport across the evaporator surfaces. The additional piece of porous material may be, for example, another wick (e.g., wick structure 202 of FIGS. 2, 3, and 5), a cut section of wick material, a specialized bit of metal foam, and/or the like. In these embodiments, the loose end of the flattened wick from the HP 201 is coupled to the additional piece of material before closing up and sealing the thermal exchange assembly 200.

4. Thermal Simulations

Thermal simulations were performed by comparing a traditional HP model against a model of the thermal exchange assembly 200. Simulation results of this comparison are presented in FIGS. 9-11, the improvement is significant. Based on the simulations, the thermal exchange assembly 200 is shown to outperform the thermal performance of the traditional HP model for both transient responses (see e.g., FIG. 11) and for steady state solutions (see e.g., FIG. 9).

Figure 9:
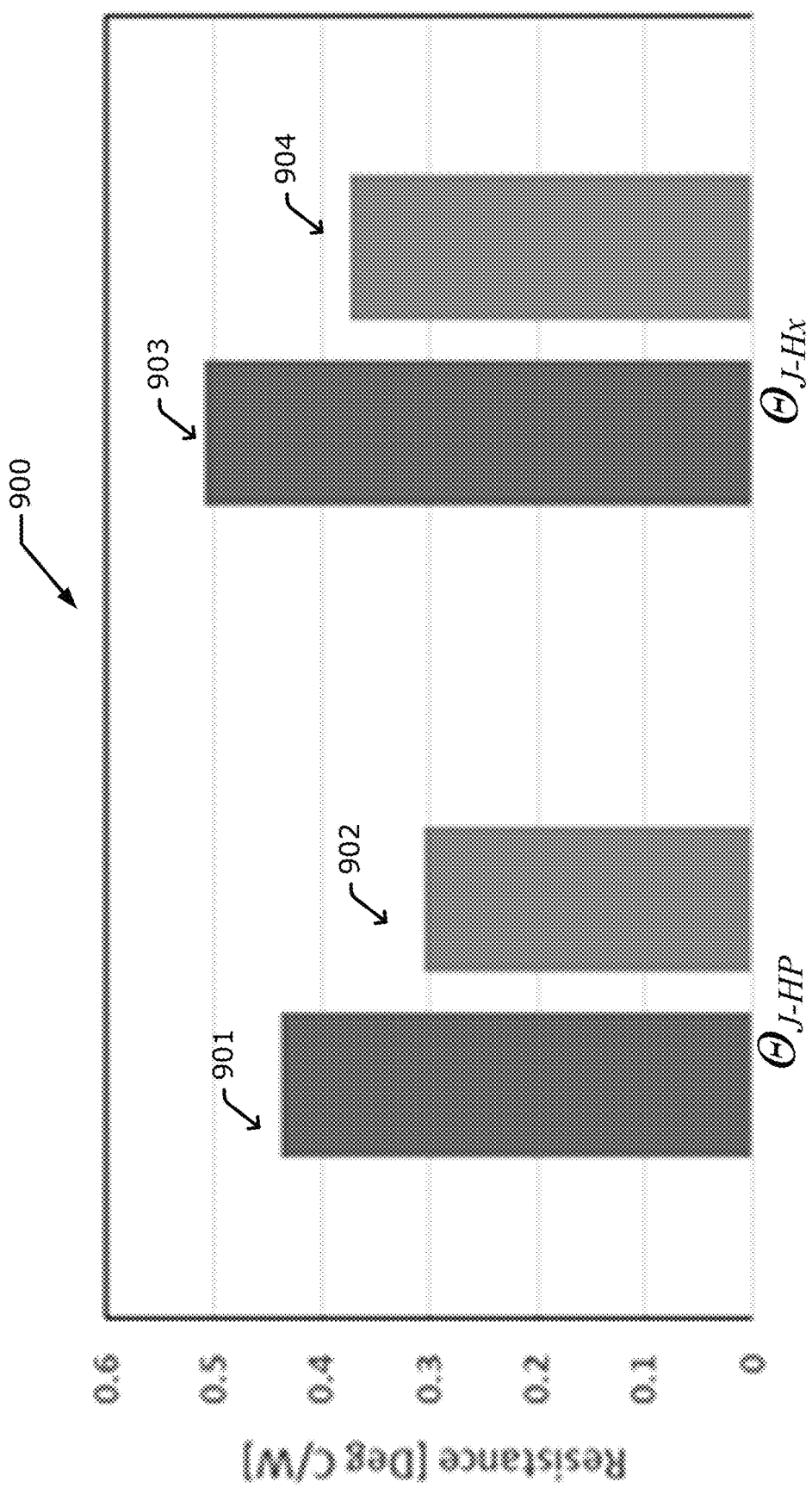
FIGS. 9, 10, and 11 show simulation results comparing a conventional heat pipe solution with the HP embodiments discussed herein.

FIG. 9 shows a graph 900 comparing thermal resistances of the traditional HP model and the thermal exchange assembly 200 model. A first portion of graph 900 shows a junction to HP thermal resistance ($\Theta_{J\text{-}HP}$) 901 for the traditional HP and the $\Theta_{J\text{-}HP}$ 902 for the thermal exchange assembly 200 using a uniform power source. The $\Theta_{J\text{-}HP}$ 901, 902 was determined by measuring the temperature of each HP and measuring the temperature at the junction, determining the temperature different ($\Delta T$), and dividing the $\Delta T$ by the heat input (Q) to the system using the uniform power source (e.g., $\Delta T/Q$). This portion of graph 900 shows the $\Theta_{J\text{-}HP}$ 902 of the thermal exchange assembly 200 being about 30.5% less than the $\Theta_{J\text{-}HP}$ 901 for the traditional HP model.

A second portion of graph 900 shows a junction to heat exchanger thermal resistance ($\Theta_{J\text{-}HX}$) 903 for the traditional HP 903 and the $\Theta_{J\text{-}HX}$ 904 for the thermal exchange assembly 200 using a uniform power source. The $\Theta_{J\text{-}HP}$ 901, 902 was determined by measuring the temperature of each HP and measuring the temperature at the heat exchanger, determining the temperature different ($\Delta T$), and dividing the $\Delta T$ by the heat input (Q) to the system using the uniform power source (e.g., $\Delta T/Q$). This portion of graph 900 shows the $\Theta_{J\text{-}HX}$ 904 for the thermal exchange assembly 200 being about 26.3% less than the $\Theta_{J\text{-}HX}$ 903 for the traditional HP model.

Figure 10:
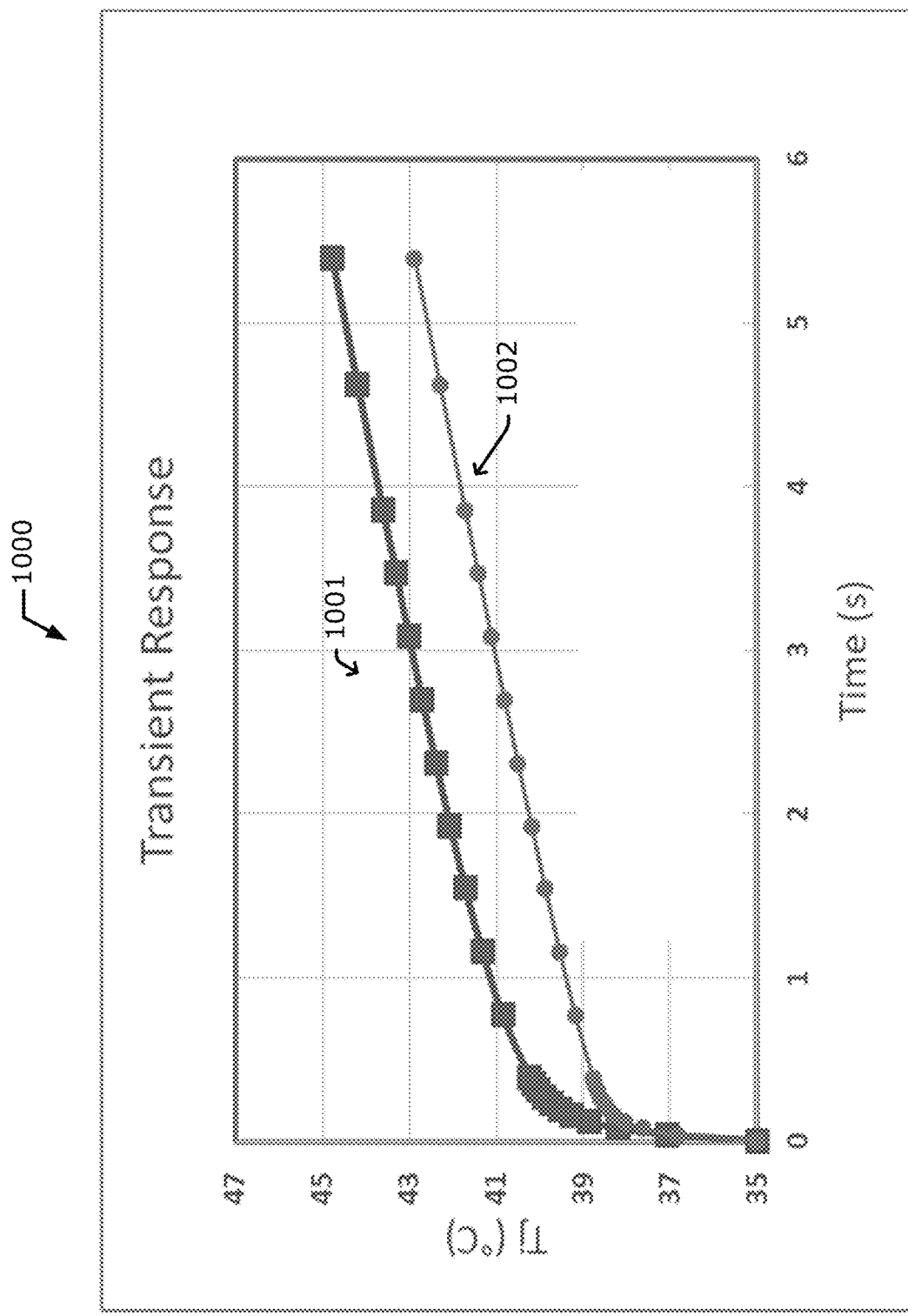

FIG. 10 shows a graph 1000 representing the transient response (Tj) as a function of time for each HP model, where line 1001 is the Tj of the traditional HP model and line 1002 is the Tj of the thermal exchange assembly 200 model. The Tj is the maximum hotspot temperature at the semiconductor device 205 where the power source is applied. The graph 1000 compares what the Tj is in the traditional HP model (line 1001) versus the thermal exchange assembly 200 model (1002). Line 1001 shows a greater Tj than the Tj shown by line 1002, which indicates that the traditional HP model is less effective than the thermal exchange assembly 200 model.

Figure 11:
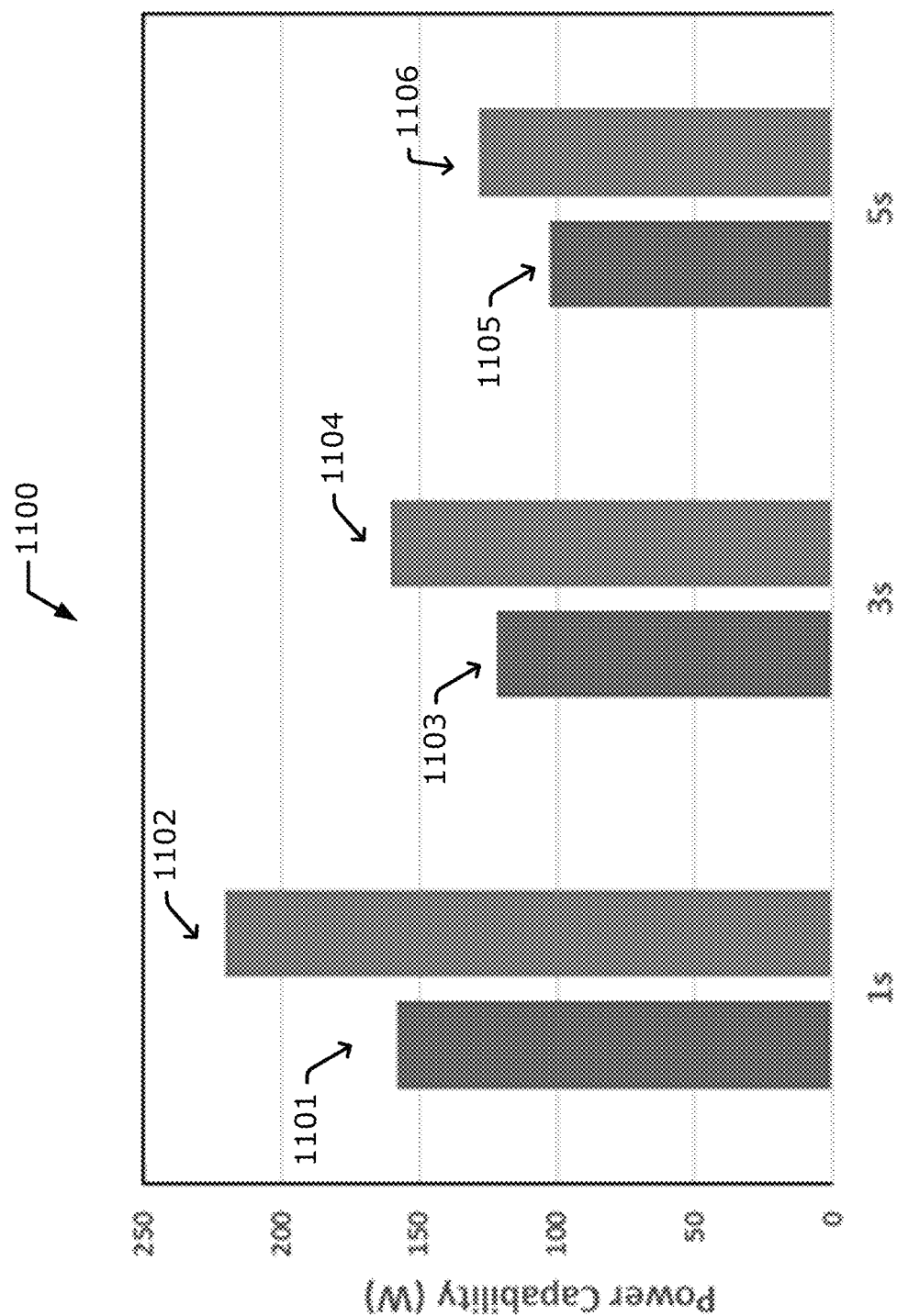

FIG. 11 shows a graph 1100 representing the power capabilities (in Watts (W)) of the semiconductor device 205 when using each HP model. Graph 1100 shows the amount of power output by semiconductor device 205 that can be supported by each thermal solution support for 1, 3, and 5 seconds before the semiconductor device 205 crosses a Tj maximum value of 100 degrees Celsius (° C.). In graph 1100, the bars 1101, 1103, and 1105 show the maximum power outputs of the semiconductor device 205 using the traditional HP model at 1, 3, and 5 seconds, respectively. Bars 1102, 1104, and 1106 show the maximum power outputs of the semiconductor device 205 using the thermal exchange assembly 200 model at 1, 3, and 5 seconds, respectively. In each case, the thermal exchange assembly 200 is able to output more power before crossing the Tj maximum value than the traditional HP model. In particular, the traditional HP model can support up to about 150 W for 1 second, whereas the thermal exchange assembly 200 can support over 200 W for 1 second.

5. Example Computing System Configurations and Arrangements

Figure 12:
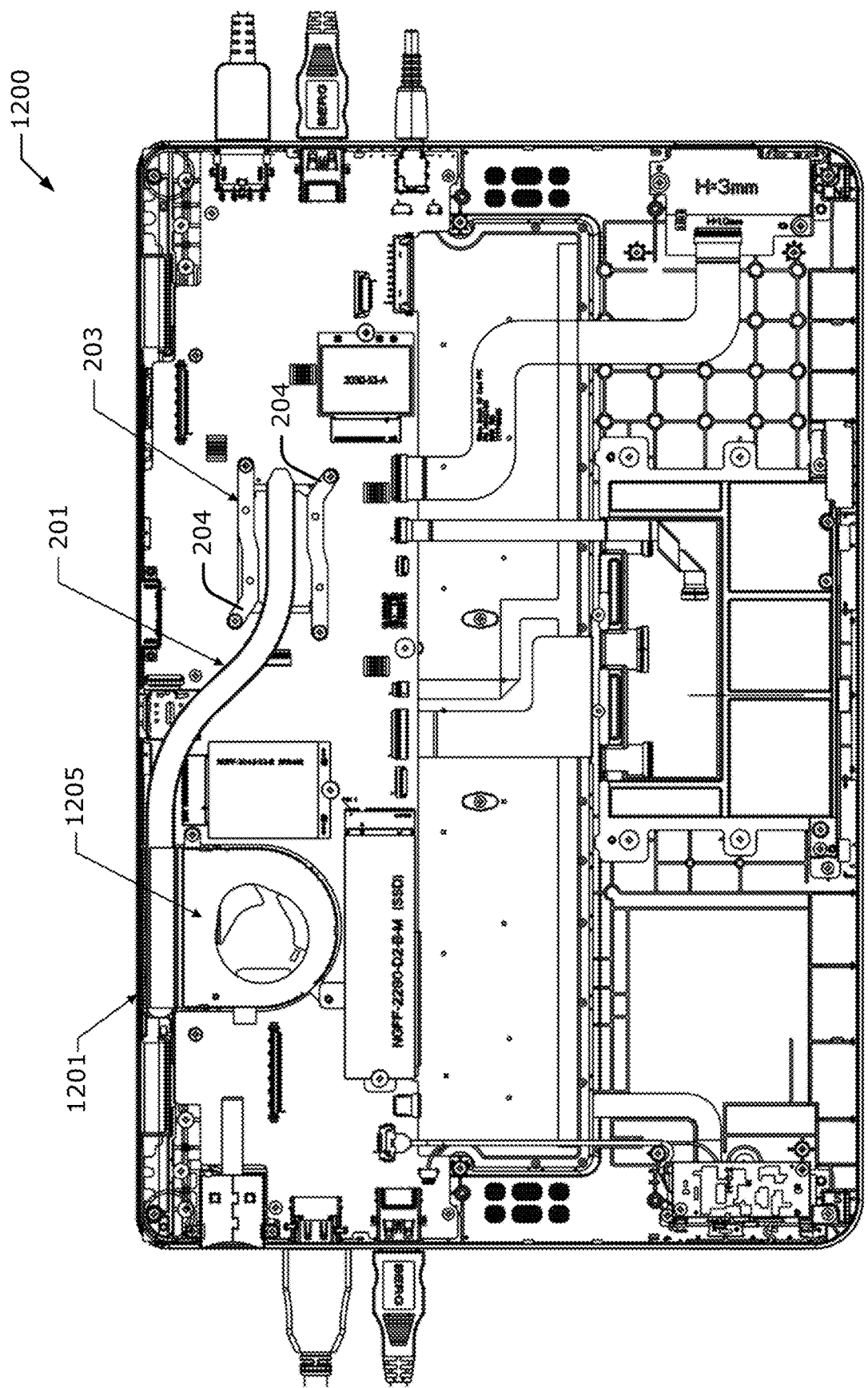
FIG. 12 shows an example computing platform including the heat pipe assembly of the embodiments discussed herein.

FIG. 12 shows an example computing platform 1200 in which the thermal exchange assembly 200 is mounted, according to various embodiments. FIG. 12 shows the placement (position and orientation) of the HP 201, cold plate 203, and springs 204, as well as a cooling device 1205 (e.g., fan) and a remote heat exchanger 1201. As alluded to previously, the evaporator section of the thermal exchange assembly 200 includes the HP 201, cold plate 203, and springs 204, and the condenser section of the thermal exchange assembly 200 includes the cooling device 1205 and the heat sink 1201.

The heat sink 1201 may be a passive heat exchanger that transfers the heat generated by an electronic device (e.g., semiconductor device 205) or a mechanical device to a fluid medium (e.g., the working fluid inside HP 201) where it is dissipated away from the semiconductor device 205 and/or platform 1200, thereby allowing regulation of the device's 205 (platform's 1200) temperature. The heat sink 1201 may be a remote heat exchanger. The cooling device 1205 is used for actively cooling platform 1200. In one example, the cooling device 1205 is a fan that moves heated air away from the components of the platform 1200 (e.g., expelling warm air from inside a case or housing of the platform 1200) and drawing cooler air over the platform 1200 devices (e.g., drawing cooler air into the case or housing). The fan 1205 may be used in combination with a heat sink (e.g., remote heat exchanger 1201) to increase the area of heated surface in contact with the air, thereby improving the efficiency of cooling. In some implementations, there may be one or multiple fans 1205 controlled by a fan speed controller. In this example, the heat transfer path is from the semiconductor device 205 to a printed circuit board (PCB) of the platform 1200, to a heat sink 1201, to air flow provided by the fan(s) 1205.

The computing platform 1200 may include other devices/components such as, for example, one or more application processors, a graphics processing unit (GPU), Baseboard Management Controller (BMC), Platform Controller Hub (PCH), memory devices (e.g., a set of dual in-line memory modules (DIMMs), network interface controller (NIC), a power sequencing controller (PSC) and/or power sequencing element (PSE), a power button, power supply unit/module, logic devices, and/or other ICs/chips within the system 1200. Furthermore, the computing platform 1200 may include hardware and software components to manage local issues such as device temperature, vibration, resource utilization, updates, power issues, physical and network security, etc. Example hardware for implementing a computing platform 1200 is described in conjunction with FIGS. 13-14.

The computing platform 1200 may be a self-contained electronic device including a housing, a chassis, a case, or shell. In some circumstances, the housing may be dimensioned for portability such that it can be carried by a human and/or shipped. In some implementations, the housing may include materials that form one or more exterior surfaces that partially or fully protect contents of the appliance, in which protection may include weather protection, hazardous environment protection (e.g., EMI, vibration, extreme temperatures), and/or enable submergibility. In some implementations, the housing may include power circuitry to provide power for stationary and/or portable implementations, such as alternating current (AC) power inputs, direct current (DC) power inputs, AC/DC or DC/AC converter(s), power regulators, transformers, charging circuitry, batteries, wired inputs and/or wireless power inputs. In some implementations, the housing and/or surfaces thereof may include or connect to mounting hardware to enable attachment to structures such as buildings, telecommunication structures (e.g., poles, antenna structures, etc.) and/or racks (e.g., server racks, blade mounts, etc.). In some implementations, the housing and/or surfaces thereof may support mechanical connectivity, such as propulsion hardware (e.g., wheels, propellers, etc.) and/or articulating hardware (e.g., robot arms, pivotable appendages, etc.). In some implementations, the housing and/or surfaces thereof may support one or more sensors (e.g., temperature sensors, vibration sensors, light sensors, acoustic sensors, capacitive sensors, proximity sensors, etc.). One or more such sensors may be contained in, carried by, or otherwise embedded in the surface and/or mounted to the surface of the platform 1200. In some implementations, the sensors may include any type of input devices such as user interface hardware (e.g., buttons, switches, dials, sliders, etc.). In some implementations, the housing includes output devices contained in, carried by, embedded therein and/or attached thereto. Output devices may include displays, touchscreens, lights, LEDs, speakers, I/O ports (e.g., USB, Ethernet, etc.), etc.

The computing platform 1200 may be employed in or as any kind of computing equipment and/or components thereof, including, for example, consumer computing systems (e.g., desktop personal computers, laptops, etc.), workstations, mobile devices (e.g., smartphones, feature phones, tablets, wearables (e.g., smartwatches or the like), mobile IoT devices, laptops, wireless equipment in vehicles, industrial automation equipment, etc.), IoT devices, network or infrastructure equipment (e.g., Macro/Micro/Femto/Pico Base Stations, repeaters, relay stations, WiFI access points, roadside units, Radio Access Network (RAN) nodes, backbone equipment, routing equipment, switches, any type of Information and Communications Technology (ICT) equipment, any type of Information Technology (IT) equipment, etc.), server computer systems (e.g., rack-mount servers, blade servers, etc.), medical systems (e.g., remote surgery, robotics, etc.), smart appliances, tactile systems, satellite systems, aviation systems, vehicular systems (e.g., computer-assisted and/or autonomous driving systems), industrial automation systems, robotics systems, etc.), and/or any other computing system/device. In some embodiments, the computing platform 1200 may be employed or deployed for a specific purpose, but may have processing and/or other capacities that may be utilized for other purposes.

Figure 13:
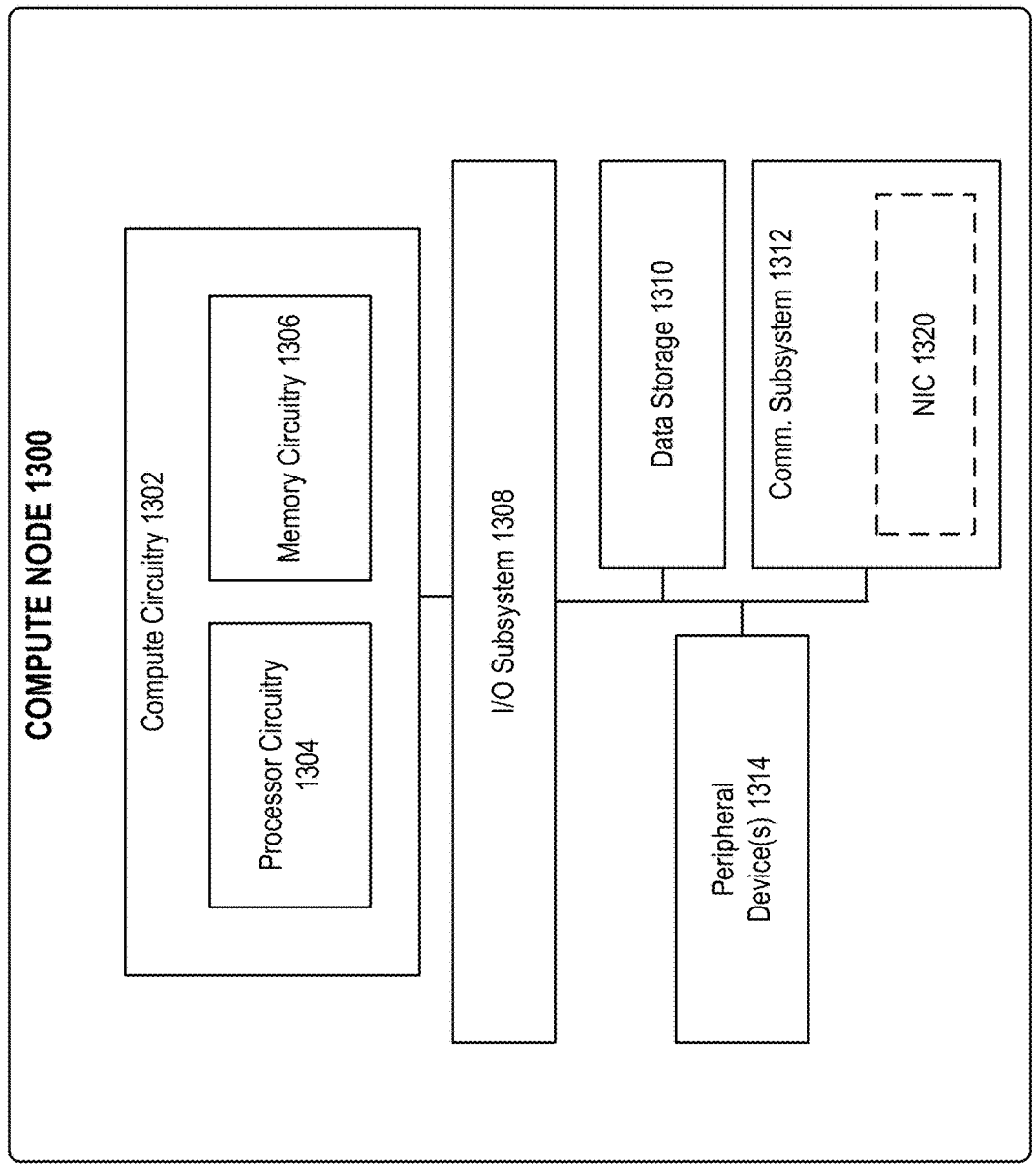
FIG. 13 depicts example components of a compute node that may incorporate the embodiments herein.

FIG. 13 depicts an example compute node 1300 that may correspond to the computing platform 1200. The compute node 1300 may be embodied as a type of computer, engine, appliance, device, collection of devices, or other "thing" capable of performing the described functions. For example, the compute node 1300 may be embodied as a single device such as an integrated circuit, an embedded system, an Field-Programmable Gate Array (FPGA), an Application Specific Integrated Circuit (ASIC) a System-on-Chip (SoC), one or more Digital Signal Processors (DSPs), or other integrated system or device. In another example, the compute node 1300 may be embodied as a smartphone, a mobile compute device, a smart appliance, an in-vehicle compute system (e.g., a navigation system), or other device or system.

The compute node 1300 includes a compute engine (also referred to herein as "compute circuitry") 1302, an input/output (I/O) subsystem 1308, data storage 1310, a communication circuitry subsystem 1312, and, optionally, one or more peripheral devices 1314. The compute node 1300 may include other or additional components, such as those typically found in a computer (e.g., a display, peripheral devices, etc.). Additionally, one or more of the illustrative components may be incorporated in, or otherwise form a portion of, another component.

The compute node 1300 includes a processor 1304 and a memory 1306. The processor 1304 may be embodied as any type of processor capable of executing program code, applications, etc. For example, the processor 1304 may be embodied as multi-core processor(s), a microcontroller, or other processor or processing/controlling circuit. In some examples, the processor 1304 may be embodied as, include, or be coupled to an FPGA, an ASIC, DSP, reconfigurable hardware or hardware circuitry, or other specialized hardware to facilitate performance of the functions described herein.

The main memory 1306 may be embodied as any type of volatile or non-volatile memory or data storage capable of performing the functions described herein. Volatile memory may be a storage medium that requires power to maintain the state of data stored by the medium. Non-limiting examples of volatile memory may include various types of random access memory (RAM), such as dynamic RAM (DRAM), static random access memory (SRAM), synchronous DRAM (SDRAM), and the like. In one example, the memory device is a block addressable memory device, such as those based on NAND or NOR technologies. A memory device may also include a three dimensional crosspoint memory device (e.g., Intel® 3D XPoint™ memory), or other byte addressable write-in-place nonvolatile memory devices. The memory device may refer to the die itself and/or to a packaged memory product. In some examples, 3D crosspoint memory (e.g., Intel® 3D XPoint™ memory) may comprise a transistor-less stackable cross point architecture in which memory cells sit at the intersection of word lines and bit lines and are individually addressable and in which bit storage is based on a change in bulk resistance. In some examples, all or a portion of the main memory 1306 may be integrated into the processor 1304. The main memory 1306 may store various software and data used during operation such as one or more applications, data operated on by the application(s), libraries, and drivers.

The compute circuitry 1302 is communicatively coupled to other components of the compute node 1300 via the I/O subsystem 1308, which may be embodied as circuitry and/or components to facilitate input/output operations with the compute circuitry 1302 (e.g., with the processor 1304 and/or the main memory 1306) and other components of the compute circuitry 1302. For example, the I/O subsystem 1308 may be embodied as, or otherwise include, memory controller hubs, input/output control hubs, integrated sensor hubs, firmware devices, communication links (e.g., point-to-point links, bus links, wires, cables, light guides, printed circuit board traces, etc.), and/or other components and subsystems to facilitate the input/output operations. In some examples, the I/O subsystem 1308 may form a portion of an SoC and be incorporated, along with one or more of the processor 1304, the main memory 1306, and other components of the compute circuitry 1302, into the compute circuitry 1302.

The one or more illustrative data storage devices 1310 may be embodied as any type of devices configured for short-term or long-term storage of data such as, for example, memory devices and circuits, memory cards, hard disk drives, solid-state drives, or other data storage devices. Individual data storage devices 1310 may include a system partition that stores data and firmware code for the data storage device 1310. Individual data storage devices 1310 may also include one or more operating system partitions that store data files and executables for operating systems depending on, for example, the type of compute node 1300.

The communication circuitry 1312 may be embodied as any communication circuit, device, or collection thereof, capable of enabling communications over a network between the compute circuitry 1302 and another compute device (e.g., an edge gateway node or the like). The communication circuitry 1312 may be configured to use any one or more communication technology (e.g., wired or wireless communications) and associated protocols (e.g., a cellular networking protocol such a 3GPP 4G or 5G standard, a wireless local area network protocol such as IEEE 802.11/WiFi®, a wireless wide area network protocol, Ethernet, Bluetooth®, Bluetooth Low Energy, a IoT protocol such as IEEE 802.15.4 or ZigBee®, low-power wide-area network (LPWAN) or low-power wide-area (LPWA) protocols, etc.) to effect such communication.

The illustrative communication circuitry 1312 includes a network interface controller (NIC) 1320, which may also be referred to as a host fabric interface (HFI). The NIC 1320 may be embodied as one or more add-in-boards, daughter cards, network interface cards, controller chips, chipsets, or other devices that may be used by the compute node 1300 to connect with another compute device. In some examples, the NIC 1320 may be embodied as part of a system-on-a-chip (SoC) that includes one or more processors, or included on a multichip package that also contains one or more processors. In some examples, the NIC 1320 may include a local processor (not shown) and/or a local memory (not shown) that are both local to the NIC 1320. In such examples, the local processor of the NIC 1320 may be capable of performing one or more of the functions of the compute circuitry 1302 described herein. Additionally or alternatively, in such examples, the local memory of the NIC 1320 may be integrated into one or more components of the client compute node 1300 at the board level, socket level, chip level, and/or other levels.

Additionally, in some examples, a respective compute node 1300 may include one or more peripheral devices 1314. Such peripheral devices 1314 may include any type of peripheral device found in a compute device or server such as audio input or output devices, a display, keyboards, a mouse, physical buttons (e.g., power button or the like), Light Emitting Diodes (LEDs) and/or other light generating elements, and/or other peripheral devices, depending on the particular type of the compute node 1300.

Figure 14:
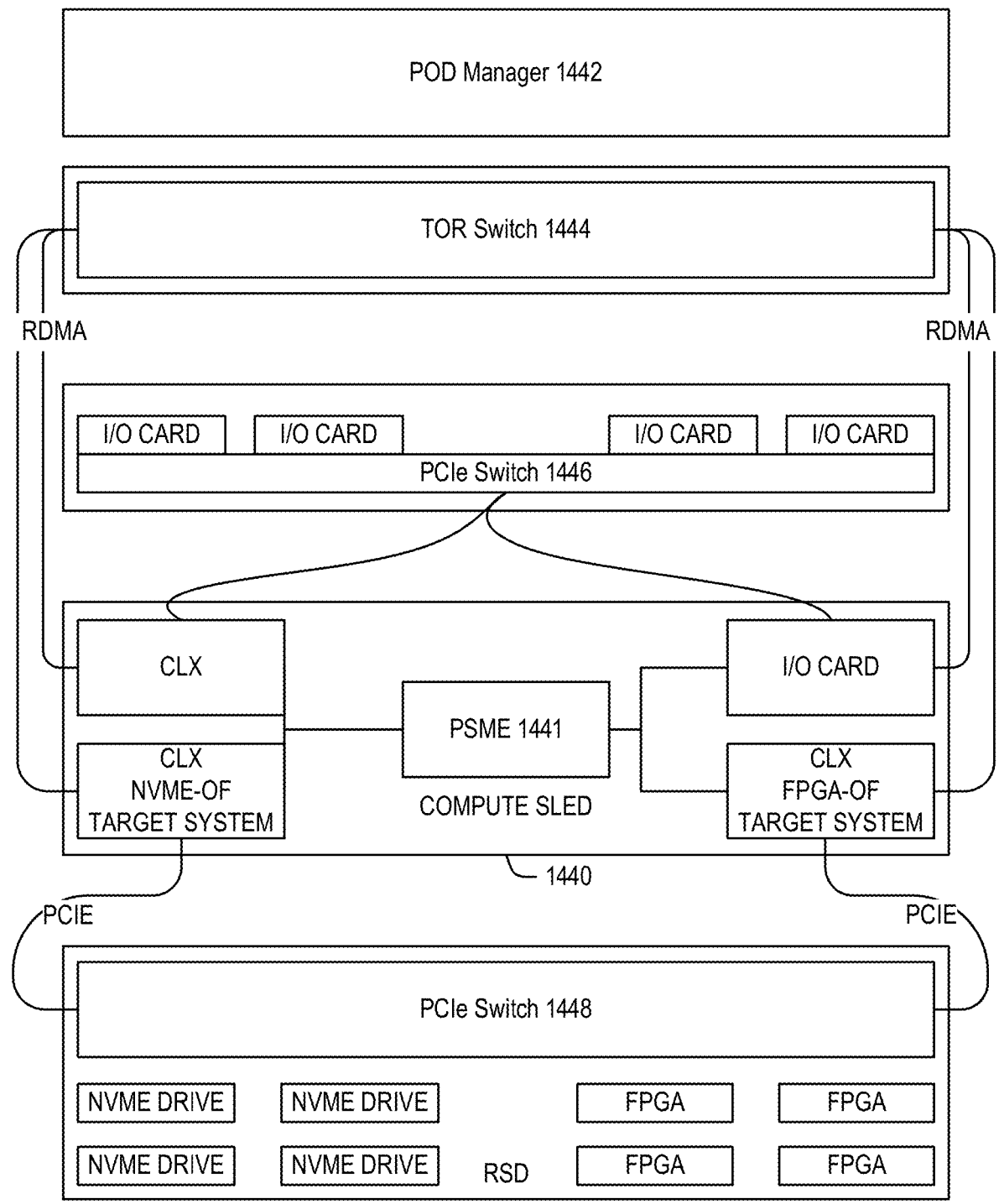
FIG. 14 depicts an example of a configurable server rack that may incorporate the embodiments herein.

FIG. 14 illustrates Rack Scale Design (RSD) components that may be included a part of a server or other discrete compute node. This arrangement provides a closer view of the configurable processing components of compute node 1300 when implemented as a server (e.g., in a server rack, blade, etc.). This configurable architecture differs from some others by disaggregating field programmable gate array (FPGA), non-volatile memory express (NVMe), and input-output (I/O) pooling resources. The FPGA and NVMe resources provide elements that may be used for any type of edge services, such as video or speech analytics. I/O pooling may be used to provide flexible NFs. This architecture enables scaling network interfaces according to the expected data rate or network load for a particular VNF. This architecture also enables flexibility to map different network cards to compute nodes depending on the type of network processing happening at a given node.

The RSD architecture includes a point of delivery (POD) Manager 1442. The POD Manager 1442 is responsible of managing the resources—including compute and disaggregated resources—within a POD (e.g., one or more racks). The POD Manager 1442 exposes interfaces to an orchestrator in order to create, manage, or destroy composed nodes. Managing a composed node includes the feature of scaling up or down the amount of pooled resources 1448 connected to a particular compute sled 1440. The POD Manager 1442 typically runs on a node controller. The POD Manager 1442 is responsible for discovery of resources in the POD, configuring and managing the resources, and composing a logical server. In an example, the POD Manager 1442 is an optional separate component and will not be required in-rack. However, in an example, to be "RSD conformant" a Rack is manageable by a certified POD Manager.

The following are some example attributes of a POD Manager 1442. For example, a rack may include a set of compute sleds 1440 used to execute edge services and other related system software stacks (e.g., such as orchestration or other system services). One type of compute sled 1440 may be a Pooled Resources Sled. This compute sled 1440 may manage a set of disaggregated resources. Here, a compute sled 1340 may include a pooled System Management Engine software (PSME) 1441. The PSME 1441 provides a management interface to manage the modules or blades at a drawer level. In an example, a rack contains one or more logical PSME(s). For example, each drawer may have a PSME or server drawers may share a PSME, or a PSME may run on a top-of-rack (TOR) 1444 switch or on a separate host. In an example, the PSME 1441 supports the RSD APIs.

In an example, the compute sled 1440 may include processors (e.g., CLX) to run an RSD software stack implementing NVM-oF or FPGA-oF acting as a target system and managing a set of disaggregated resources. In an example, the processors are connected using PCIe x16 bifurcation port to a PCIe switch 1446 providing access to the target resources (FPGA or NVME in the RSD 1448).

Various RSD edge-composed node flavors may be used in the compute sled 1440 to run edge services. Services running on those nodes may use client software libraries or drivers to provide transparent access to the disaggregated FPGAS and NVME in the RSD 1448. In a further example, the rack includes one or more PCIe switches connecting the compute sleds 1440 to a set of disaggregated resources (e.g., RSD 1448).

The illustrations of FIGS. 13 and 14 are intended to depict a high-level view of components of a varying device, subsystem, or arrangement of an edge computing node. However, it should be understood that some of the components shown may be omitted, additional components may be present, and a different arrangement of the components shown may occur in other implementations. Further, these arrangements are usable in a variety of use cases and environments, including those discussed herein (e.g., a mobile UE in industrial compute for smart city or smart factory, among many other examples).

6. Example Implementations

Additional examples of the presently described method, system, and device embodiments include the following, non-limiting implementations. Each of the following non-limiting examples may stand on its own or may be combined in any permutation or combination with any one or more of the other examples provided below or throughout the present disclosure.

Example 1 includes a thermal exchange assembly comprising: a cold plate configured to be placed on a semiconductor device, the cold plate including a window section; and a heat pipe (HP) directly coupled to the cold plate, the HP including a window, the window being a recessed or depressed portion of the HP, and wherein the window is disposed on the window section.

Example 2 includes the thermal exchange assembly of example 1 and/or some other example(s) herein, further comprising: a wick structure disposed between the window and the window section.

Example 3 includes the thermal exchange assembly of example 2 and/or some other example(s) herein, wherein the wick structure extends from inside the HP and out of the window, and attaches to the window section of the cold plate.

Example 4 includes the thermal exchange assembly of examples 2-3 and/or some other example(s) herein, wherein the wick structure is a first wick structure, and the HP includes a second wick structure separate from the first wick structure.

Example 5 includes the thermal exchange assembly of example 4 and/or some other example(s) herein, wherein the first wick structure is a different type of wick structure than the second wick structure, or the first wick structure is a same type of wick structure as the second wick structure.

Example 6 includes the thermal exchange assembly of examples 4-5 and/or some other example(s) herein, wherein the second wick structure extends from inside the HP and out of the window and is attached to a top portion of the first wick structure, and a bottom portion of the first wick structure is attached to the window section of the cold plate.

Example 7 includes the thermal exchange assembly of examples 1-6 and/or some other example(s) herein, further comprising: a pedestal section disposed inside the window.

Example 8 includes the thermal exchange assembly of examples 1-7 and/or some other example(s) herein, wherein the window comprises a plurality of fins, each fin of the plurality of fins extending vertically from the window, laterally separated from other fins of the plurality of fins, and forming a plurality of slots arranged between each fin of the plurality of fins, wherein the plurality of fins are oriented longitudinally with respect to the HP or the plurality of fins are oriented diagonally with respect to the HP.

Example 9 includes the thermal exchange assembly of example 8, wherein at least one fin of the plurality of fins has a different width than one or more other fins of the plurality of fins.

Example 10 includes the thermal exchange assembly of examples 8-9, wherein at least one slot of the plurality of slots has a different depth than one or more other slots of the plurality of slots.

Example 11 includes the thermal exchange assembly of examples 1-10 and/or some other example(s) herein, wherein the window comprises a plurality of holes extending vertically into the HP and having circular or elliptical shaped openings.

Example 12 includes the thermal exchange assembly of examples 1-11 and/or some other example(s) herein, wherein the cold plate comprises a plurality of pins extending vertically from the cold plate, wherein each pin of the plurality of pins includes a hole in a center portion of each pin, and the hole in the center portion of each pin has a circular or elliptical shaped opening.

Example 13 includes the thermal exchange assembly of example 12, wherein at least one pin of the plurality of pins has a hole with a different depth than holes of one or more other pins of the plurality of slots.

Example 14 includes the thermal exchange assembly of examples 1-13 and/or some other example(s) herein, wherein the cold plate comprises a plurality of holes extending vertically into the cold plate, each hole of the plurality of holes having circular or elliptical shaped openings.

Example 15 includes the thermal exchange assembly of example 14, wherein at least one pin of the plurality of pins has a hole with a different depth than holes of one or more other pins of the plurality of slots.

Example 16 includes the thermal exchange assembly of examples 1-15 and/or some other example(s) herein, wherein the thermal exchange assembly further includes attachment springs configured to mount the thermal exchange assembly in a chassis of a computing system.

Example 17 includes the thermal exchange assembly of examples 1-16 and/or some other example(s) herein, wherein the cold plate is formed of copper, a copper alloy, aluminum, or an aluminum alloy.

Example 18 includes the thermal exchange assembly of examples 1-17 and/or some other example(s) herein, wherein the HP is formed from copper, a copper alloy, aluminum, an aluminum alloy epoxy-impregnated carbon fiber, or graphene.

Example 19 includes a method for fabricating a thermal exchange assembly, the method comprising: forming a window in a flattened heat pipe (HP), the window being a recessed or depressed portion of the HP; coupling the flattened HP directly to a cold plate such that a seal is made between the window and a window section of the cold plate; evacuating the HP; adding a working fluid to the evacuated HP; and hermetically sealing the HP.

Example 20 includes the method of example 19 and/or some other example(s) herein, wherein the forming the window in the flattened HP includes performing one or more fabrication techniques selected from a group comprising: cutting, bending, forging, assembling, molding, casting, and additive manufacturing.

Example 21 includes the method of examples 19-20 and/or some other example(s) herein, wherein the coupling the HP to the cold plate includes performing a one or more coupling techniques selected from a group comprising: welding, soldering, and brazing.

Example 22 includes the method of examples 19-21 and/or some other example(s) herein, wherein the coupling the HP to the cold plate includes comprises soldering the HP to the cold plate, and a solder alloy used for the soldering is based on chemical properties of the working fluid.

Example 23 includes the method of example 22, further comprising: coupling a wick structure to the window section before or during the coupling of the HP to the cold plate.

Example 24 includes the method of example 23, further comprising: coupling a native wick structure of the HP to the wick structure before or during the coupling of the wick structure to the window section.

Example 25 includes the method of example 24, wherein coupling the wick structure to the window section and coupling the native wick structure to the wick structure includes performing one or more coupling techniques selected from a group comprising: welding, soldering, brazing, and weaving.

Example 26 includes the method of examples 21-25 and/or some other example(s) herein, further comprising: forming an arrangement of pins or slots in the window section of the cold plate prior to coupling the flattened HP directly to the cold plate.

Example 27 includes a computing platform comprising: a board; a semiconductor device mounted on the board; and a thermal exchange assembly disposed on the semiconductor device, the thermal exchange assembly including a condenser section and an evaporator section, the condenser section comprising a cooling device and a heat sink, and the evaporator section including: attachment springs coupling the thermal exchange assembly to the board, a cold plate including a window section and directly disposed on the semiconductor device, and a heat pipe (HP) including a window which is a recessed or depressed portion of the HP, the HP being directly coupled to the cold plate by a seal around the window and the window section.

Example 28 includes the computing platform of example 27, wherein the thermal exchange assembly further comprises: a wick structure disposed between the window and the window section, wherein the wick structure is an internal wick structure of the HP or the wick structure is a different wick structure separate from the internal wick structure of the HP.

Example 29 includes the computing platform of examples 27-28 and/or some other example(s) herein, wherein the window comprises: a plurality of fins, each fin of the plurality of fins extending vertically from the window, laterally separated from other fins of the plurality of fins, and forming a plurality of slots arranged between each fin of the plurality of fins, wherein the plurality of fins are oriented longitudinally with respect to the HP or the plurality of fins are oriented diagonally with respect to the HP; or a plurality of holes extending vertically into the HP and having circular or elliptical shaped openings.

Example 30 includes the computing platform of examples 27-29 and/or some other example(s) herein, wherein the computing platform is a desktop computer, a workstation, a laptop, a server, a network appliance, a mobile device, an Internet of Things (IoT) device, network equipment, a medical device, a smart appliance, a tactile computing system, a satellite computing system, aviation systems, vehicular computing system, an industrial automation computing system, and/or a robot.

Example 31 includes the thermal exchange assembly of examples 1-18 and/or some other example(s) herein, wherein the thermal exchange assembly is mounted in a computing platform, and the computing platform is a desktop computer, a workstation, a laptop, a server, a network appliance, a mobile device, an Internet of Things (IoT) device, network equipment, a medical device, a smart appliance, a tactile computing system, a satellite computing system, aviation systems, vehicular computing system, an industrial automation computing system, and/or a robot Example Z01 includes one or more computer readable media comprising instructions, wherein execution of the instructions by processor circuitry is to cause the processor circuitry to perform the method of any one of examples 1-31. Example Z02 includes a computer program comprising the instructions of example Z01. Example Z03a includes an Application Programming Interface defining functions, methods, variables, data structures, and/or protocols for the computer program of example Z02. Example Z03b includes an API or specification defining functions, methods, variables, data structures, protocols, etc., defining or involving use of any of examples 1-31 or portions thereof, or otherwise related to any of examples 1-31 or portions thereof. Example Z04 includes an apparatus comprising circuitry loaded with the instructions of example Z01. Example Z05 includes an apparatus comprising circuitry operable to run the instructions of example Z01. Example Z06 includes an integrated circuit comprising one or more of the processor circuitry of example 1 and the one or more computer readable media of example Z01. Example Z07 includes a computing system comprising the one or more computer readable media and the processor circuitry of example Z01. Example Z08 includes an apparatus comprising means for executing the instructions of example Z01. Example Z09 includes a signal generated as a result of executing the instructions of example Z01. Example Z10 includes a data unit generated as a result of executing the instructions of example Z01. Example Z11 includes the data unit of example Z10 and/or some other example(s) herein, wherein the data unit is a datagram, network packet, data frame, data segment, a Protocol Data Unit (PDU), a Service Data Unit (SDU), a message, or a database object. Example Z12 includes a signal encoded with the data unit of examples Z10 and/or Z11. Example Z13 includes an electromagnetic signal carrying the instructions of example Z01. Example Z14 includes an apparatus comprising means for performing the method of any one of examples 1-31 and/or some other example(s) herein.

7. Terminology

As used herein, the singular forms "a," "an" and "the" are intended to include plural forms as well, unless the context clearly indicates otherwise. It will be further understood that the terms "comprises" and/or "comprising," when used in this specification, specific the presence of stated features, integers, steps, operations, elements, and/or components, but do not preclude the presence or addition of one or more other features, integers, steps, operation, elements, components, and/or groups thereof. The phrase "A and/or B" means (A), (B), or (A and B). For the purposes of the present disclosure, the phrase "A, B, and/or C" means (A), (B), (C), (A and B), (A and C), (B and C), or (A, B and C). The description may use the phrases "in an embodiment," or "In some embodiments," which may each refer to one or more of the same or different embodiments. Furthermore, the terms "comprising," "including," "having," and the like, as used with respect to embodiments of the present disclosure, are synonymous.

The terms "coupled," "communicatively coupled," along with derivatives thereof are used herein. The term "coupled" may mean two or more elements are in direct physical or electrical contact with one another, may mean that two or more elements indirectly contact each other but still cooperate or interact with each other, and/or may mean that one or more other elements are coupled or connected between the elements that are said to be coupled with each other. The term "directly coupled" may mean that two or more elements are in direct contact with one another. The term "communicatively coupled" may mean that two or more elements may be in contact with one another by a means of communication including through a wire or other interconnect connection, through a wireless communication channel or ink, and/or the like.

The term "coupling", "coupling means", or the like refers to device that mechanically and/or chemically joins or couples two or more objects together, and may include threaded fasteners (e.g., bolts, screws, nuts, threaded rods, etc.), pins, linchpins, r-clips, clips, pegs, clamps, dowels, cam locks, latches, catches, ties, hooks, magnets, rivets, assembled joineries, molded joineries, metallurgical formed joints/bonds (e.g., by welding, brazing, soldering, etc.), adhesive bonds, and/or the like. Additionally or alternatively, the term "coupling", "coupling means", or the like refers to the act of mechanically and/or chemically joining or coupling two or more objects together, and may include any type of fastening, welding, brazing, soldering, sintering, casting, plating, adhesive bonding, and/or the like.

The term "fabrication" refers to the formation, construction, or creation of a structure using any combination of materials and/or using fabrication means. The term "fabrication means" as used herein refers to any suitable tool or machine that is used during a fabrication process and may involve tools or machines for cutting (e.g., using manual or powered saws, shears, chisels, routers, torches including handheld torches such as oxy-fuel torches or plasma torches, and/or computer numerical control (CNC) cutters including lasers, mill bits, torches, water jets, routers, laser etching tools/machines, tolls/machines for printed circuit board (PCB) and/or semiconductor manufacturing, etc.), bending (e.g., manual, powered, or CNC hammers, pan brakes, press brakes, tube benders, roll benders, specialized machine presses, etc.), forging (e.g., forging press, machines/tools for roll forging, swaging, cogging, open-die forging, impression-die forging (close die forging), press forging, cold forging automatic hot forging and upsetting, etc.), assembling (e.g., by welding, soldering, brazing, crimping, coupling with adhesives, riveting, fasteners, etc.), molding or casting (e.g., die casting, centrifugal casting, injection molding, extrusion molding, matrix molding, etc.), additive manufacturing (e.g., direct metal laser sintering, filament winding, fused deposition modeling, laminated object manufacturing techniques, induction printing, selecting laser sintering, spark plasma sintering, stereolithographic, three-dimensional (3D) printing techniques including fused deposition modeling, selective laser melting, selective laser sintering, composite filament fabrication, fused filament fabrication, stereo lithography, directed energy deposition, electron beam freeform fabrication, etc.), PCB and/or semiconductor manufacturing techniques (e.g., silk-screen printing, photolithography, photoengraving, PCB milling, laser resist ablation, laser etching, plasma exposure, atomic layer deposition (ALD), molecular layer deposition (MLD), chemical vapor deposition (CVD), rapid thermal processing (RTP), and/or the like).

The terms "flexible," "flexibility," and/or "pliability" refer to the ability of an object or material to bend or deform in response to an applied force; "the term "flexible" is complementary to "stiffness." The term "stiffness" and/or "rigidity" refers to the ability of an object to resist deformation in response to an applied force. The term "elasticity" refers to the ability of an object or material to resist a distorting influence or stress and to return to its original size and shape when the stress is removed. Elastic modulus (a measure of elasticity) is a property of a material, whereas flexibility or stiffness is a property of a structure or component of a structure and is dependent upon various physical dimensions that describe that structure or component.

The term "wear" refers to the phenomenon of the gradual removal, damaging, and/or displacement of material at solid surfaces due to mechanical processes (e.g., erosion) and/or chemical processes (e.g., corrosion). Wear causes functional surfaces to degrade, eventually leading to material failure or loss of functionality. The term "wear" as used herein may also include other processes such as fatigue (e.g., the weakening of a material caused by cyclic loading that results in progressive and localized structural damage and the growth of cracks) and creep (e.g., the tendency of a solid material to move slowly or deform permanently under the influence of persistent mechanical stresses). Mechanical wear may occur as a result of relative motion occurring between two contact surfaces. Wear that occurs in machinery components has the potential to cause degradation of the functional surface and ultimately loss of functionality. Various factors, such as the type of loading, type of motion, temperature, lubrication, and the like may affect the rate of wear.

The term "lateral" refers to directions or positions relative to an object spanning the width of a body of the object, relating to the sides of the object, and/or moving in a sideways direction with respect to the object. The term "longitudinal" refers to directions or positions relative to an object spanning the length of a body of the object; relating to the top or bottom of the object, and/or moving in an upwards and/or downwards direction with respect to the object. The term "linear" refers to directions or positions relative to an object following a straight line with respect to the object, and/or refers to a movement or force that occurs in a straight line rather than in a curve. The term "lineal" refers to directions or positions relative to an object following along a given path with respect to the object, wherein the shape of the path is straight or not straight.

The term "circuitry" refers to a circuit or system of multiple circuits configurable to perform a particular function in an electronic device. The circuit or system of circuits may be part of, or include one or more hardware components, such as a logic circuit, a processor (shared, dedicated, or group) and/or memory (shared, dedicated, or group), an Application Specific Integrated Circuit (ASIC), a field-programmable gate array (FPGA), programmable logic device (PLD), System-on-Chip (SoC), System-in-Package (SiP), Multi-Chip Package (MCP), digital signal processor (DSP), etc., that are configurable to provide the described functionality. In addition, the term "circuitry" may also refer to a combination of one or more hardware elements with the program code used to carry out the functionality of that program code. Some types of circuitry may execute one or more software or firmware programs to provide at least some of the described functionality. Such a combination of hardware elements and program code may be referred to as a particular type of circuitry.

It should be understood that the functional units or capabilities described in this specification may have been referred to or labeled as components or modules, in order to more particularly emphasize their implementation independence. Such components may be embodied by any number of software or hardware forms. For example, a component or module may be implemented as a hardware circuit comprising custom very-large-scale integration (VLSI) circuits or gate arrays, off-the-shelf semiconductors such as logic chips, transistors, or other discrete components. A component or module may also be implemented in programmable hardware devices such as field programmable gate arrays, programmable array logic, programmable logic devices, or the like. Components or modules may also be implemented in software for execution by various types of processors. An identified component or module of executable code may, for instance, comprise one or more physical or logical blocks of computer instructions, which may, for instance, be organized as an object, procedure, or function. Nevertheless, the executables of an identified component or module need not be physically located together but may comprise disparate instructions stored in different locations which, when joined logically together, comprise the component or module and achieve the stated purpose for the component or module.

Indeed, a component or module of executable code may be a single instruction, or many instructions, and may even be distributed over several different code segments, among different programs, and across several memory devices or processing systems. In particular, some aspects of the described process (such as code rewriting and code analysis) may take place on a different processing system (e.g., in a computer in a data center) than that in which the code is deployed (e.g., in a computer embedded in a sensor or robot). Similarly, operational data may be identified and illustrated herein within components or modules and may be embodied in any suitable form and organized within any suitable type of data structure. The operational data may be collected as a single data set or may be distributed over different locations including over different storage devices, and may exist, at least partially, merely as electronic signals on a system or network. The components or modules may be passive or active, including agents operable to perform desired functions.

As used herein, the term "compute node" or "compute device" refers to an identifiable entity implementing an aspect of computing operations, whether part of a larger system, distributed collection of systems, or a standalone apparatus. In some examples, a compute node may be referred to as a "node", "computing device", "computing system", whether in operation as a client, server, or intermediate entity. Specific implementations of a compute node may be incorporated into a server, base station, gateway, road side unit, on premise unit, UE, end consuming device, or the like.

The term "computer system" as used herein refers to any type interconnected electronic devices, computer devices, or components thereof. Additionally, the term "computer system" and/or "system" may refer to various components of a computer that are communicatively coupled with one another. Furthermore, the term "computer system" and/or "system" may refer to multiple computer devices and/or multiple computing systems that are communicatively coupled with one another and configured to share computing and/or networking resources. The term "architecture" as used herein refers to a computer architecture or a network architecture. A "network architecture" is a physical and logical design or arrangement of software and/or hardware elements in a network including communication protocols, interfaces, and media transmission. A "computer architecture" is a physical and logical design or arrangement of software and/or hardware elements in a computing system or platform including technology standards for interacts therebetween. The term "appliance," "computer appliance," or the like, as used herein refers to a computer device or computer system with program code (e.g., software or firmware) that is specifically designed to provide a specific computing resource.

Although these implementations have been described with reference to specific exemplary aspects, it will be evident that various modifications and changes may be made to these aspects without departing from the broader scope of the present disclosure. Many of the arrangements and processes described herein can be used in combination or in parallel implementations to provide greater bandwidth/throughput and to support edge services selections that can be made available to the edge systems being serviced. Accordingly, the specification and drawings are to be regarded in an illustrative rather than a restrictive sense. The accompanying drawings that form a part hereof show, by way of illustration, and not of limitation, specific aspects in which the subject matter may be practiced. The aspects illustrated are described in sufficient detail to enable those skilled in the art to practice the teachings disclosed herein. Other aspects may be utilized and derived therefrom, such that structural and logical substitutions and changes may be made without departing from the scope of this disclosure. This Detailed Description, therefore, is not to be taken in a limiting sense, and the scope of various aspects is defined only by the appended claims, along with the full range of equivalents to which such claims are entitled.

Such aspects of the inventive subject matter may be referred to herein, individually and/or collectively, merely for convenience and without intending to voluntarily limit the scope of this application to any single aspect or inventive concept if more than one is in fact disclosed. Thus, although specific aspects have been illustrated and described herein, it should be appreciated that any arrangement calculated to achieve the same purpose may be substituted for the specific aspects shown. This disclosure is intended to cover any and all adaptations or variations of various aspects. Combinations of the above aspects and other aspects not specifically described herein will be apparent to those of skill in the art upon reviewing the above description.

The invention claimed is:

1. A thermal exchange assembly comprising:
   a cold plate configured to be directly coupled to a semiconductor device, the cold plate including a first window section that comprises a recessed or depressed portion of the cold plate and has a first window section depth that is a portion of a thickness of the cold plate; and
   a heat pipe (HP) that is a separate structure from the cold plate, the HP being directly coupled to the cold plate,
   wherein the HP includes a second window section that comprises a recessed or depressed portion of the HP and has a second window section depth that is a portion of a thickness of the HP,
   wherein the second window section of the HP is disposed on the first window section, and
   wherein a cavity is formed by the first window section depth and the second window section depth and comprises a space formed between the portion of the thickness of the cold plate and the portion of the thickness of the HP.

2. The thermal exchange assembly of claim 1, further comprising:
   a wick structure disposed within the cavity.

3. The thermal exchange assembly of claim 2, wherein the wick structure extends from inside the HP and out of the second window section, and attaches to the first window section of the cold plate.

4. The thermal exchange assembly of claim 2, wherein the wick structure is a first wick structure, and the HP includes a second wick structure separate from the first wick structure.

5. The thermal exchange assembly of claim 4, wherein the second wick structure extends from inside the HP and out of the second window section and is attached to a top portion of the first wick structure, and
   wherein a bottom portion of the first wick structure is attached to the first window section of the cold plate.

6. The thermal exchange assembly of claim 2, wherein the wick structure extends in a longitudinal direction that is perpendicular to a direction of the thickness of the cold plate and a direction of the thickness of the HP.

7. The thermal exchange assembly of claim 1, further comprising:
   a pedestal section disposed inside the second window section.

8. The thermal exchange assembly of claim 1, wherein the second window section comprises a plurality of fins, each fin of the plurality of fins extending vertically from the second window section and being laterally separated from other fins of the plurality of fins,
   wherein a plurality of slots are arranged between each fin of the plurality of fins, and
   wherein the plurality of fins are oriented longitudinally with respect to the HP.

9. The thermal exchange assembly of claim 1, wherein the second window section comprises a plurality of holes extending vertically into the HP.

10. The thermal exchange assembly of claim 1, wherein:
    the cold plate comprises a plurality of pins extending vertically from the cold plate,
    each pin of the plurality of pins includes a hole in a center portion thereof, and
    the hole in the center portion of each pin has a circular or elliptical shaped opening.

11. The thermal exchange assembly of claim 1, wherein the cold plate comprises a plurality of holes extending vertically into the cold plate.

12. The thermal exchange assembly of claim 11, wherein the cold plate comprises a plurality of pins extending vertically from the cold plate.

13. The thermal exchange assembly of claim 1, wherein the thermal exchange assembly further comprises:
    attachment springs configured to mount the thermal exchange assembly in a chassis of a computing system.

14. The thermal exchange assembly of claim 1, wherein the cold plate is formed of copper, a copper alloy, aluminum, or an aluminum alloy.

15. The thermal exchange assembly of claim 1, wherein the HP is formed from copper, a copper alloy, aluminum, an aluminum alloy, epoxy-impregnated carbon fiber, or graphene.

16. The thermal exchange assembly of claim 1, wherein the second window section comprises a plurality of fins, each fin of the plurality of fins extending vertically from the second window section and being laterally separated from other fins of the plurality of fins,
    wherein a plurality of slots are arranged between each fin of the plurality of fins, and
    wherein the plurality of fins are oriented diagonally with respect to the HP.

17. The thermal exchange assembly of claim 1, wherein the second window section comprises a plurality of fins oriented in a longitudinal direction that is perpendicular to a direction of the thickness of the cold plate and a direction of the thickness of the HP.

* * * * *